US012601978B2

(12) United States Patent
Schneider et al.

(10) Patent No.: US 12,601,978 B2
(45) Date of Patent: Apr. 14, 2026

(54) METHOD OF SETTING UP A PROJECTION EXPOSURE SYSTEM, A PROJECTION EXPOSURE METHOD AND A PROJECTION EXPOSURE SYSTEM FOR MICROLITHOGRAPHY

(71) Applicants: Carl Zeiss SMT GmbH, Oberkochen (DE); ASML NETHERLANDS B.V., Veldhoven (NL)

(72) Inventors: Eva Schneider, Aalen (DE); Toralf Gruner, Aalen (DE); Timur Tudorovskiy, Veldhoven (NL)

(73) Assignees: CARL ZEISS SMT GMBH, Oberkochen (DE); ASML NETHERLANDS B.V., Veldhoven (NL)

( * ) Notice: Subject to any disclaimer, the term of this patent is extended or adjusted under 35 U.S.C. 154(b) by 136 days.

(21) Appl. No.: 18/223,687

(22) Filed: Jul. 19, 2023

(65) Prior Publication Data

US 2023/0367231 A1 Nov. 16, 2023

Related U.S. Application Data

(63) Continuation of application No. PCT/EP2021/050977, filed on Jan. 19, 2021.

(51) Int. Cl.
*G03F 7/00* (2006.01)

(52) U.S. Cl.
CPC .......... *G03F 7/706* (2013.01); *G03F 7/70258* (2013.01); *G03F 7/70266* (2013.01); *G03F 7/70508* (2013.01); *G03F 7/70525* (2013.01)

(58) Field of Classification Search
CPC .. G03F 7/706; G03F 7/70258; G03F 7/70266; G03F 7/70508; G03F 7/70525
See application file for complete search history.

(56) References Cited

U.S. PATENT DOCUMENTS 5,420,436 A * 5/1995 Seya .................... G03F 7/70233
356/498
6,327,025 B1 12/2001 Imai
(Continued)

FOREIGN PATENT DOCUMENTS

DE 102016205618 A1 3/2017
EP 2219077 A1 8/2010
(Continued)

OTHER PUBLICATIONS

International Search Report and the Written Opinion, PCT/EP2021/050977, Oct. 22, 2021, 18 pages.
(Continued)

*Primary Examiner* — Steven H Whitesell
(74) *Attorney, Agent, or Firm* — Edell, Shapiro & Finnan, LLC

(57) ABSTRACT

A measuring system (MS) configured to measure a projection radiation property representing an aberration level at a plurality of spaced apart measuring points distributed in the image field; and an operating control system with at least one manipulator operatively connected to an optical element of a projection exposure system to modify imaging properties of the projection exposure system based on measurement results generated by the measuring system. In a measuring point distribution calculation (MPDC), a measuring point distribution defining a number and positions of measuring points is used. The MPDC is performed under boundary conditions representing at least: (i) manipulation capacities of the operating control system; (ii) measuring capacities of the measuring system; and (iii) predefined use case scenarios defining a set of representative use cases. Each use case corresponds to a specific aberration pattern generated by the projection exposure system under a predefined set of use conditions.

22 Claims, 10 Drawing Sheets

(56)     References Cited

U.S. PATENT DOCUMENTS

| | | | | |
|---|---|---|---|---|
| 6,559,952 | B1* | 5/2003 | Bokor ................ | G01B 9/02043 |
| | | | | 356/520 |
| 6,650,399 | B2 | 11/2003 | Baselmans et al. | |
| 6,819,414 | B1* | 11/2004 | Takeuchi ................ | G03F 7/706 |
| | | | | 356/124 |
| 7,333,216 | B2 | 2/2008 | Wegmann et al. | |
| 2002/0001088 | A1* | 1/2002 | Wegmann ................ | G03F 7/706 |
| | | | | 356/521 |
| 2010/0020302 | A1* | 1/2010 | Freimann ................ | G01J 1/0411 |
| | | | | 355/68 |
| 2012/0188524 | A1* | 7/2012 | Bittner ................ | G03F 7/70533 |
| | | | | 359/811 |
| 2016/0161845 | A1 | 6/2016 | Bittner et al. | |
| 2017/0068166 | A1* | 3/2017 | Petri .................... | G01N 21/956 |
| 2019/0086822 | A1* | 3/2019 | Arahara ............. | G01B 11/2522 |
| 2020/0081350 | A1 | 3/2020 | Gruner | |

FOREIGN PATENT DOCUMENTS

| | | | |
|---|---|---|---|
| JP | H0837149 | A | 2/1996 |
| JP | 3555230 | B2 | 8/2004 |
| JP | 2009121951 | A | 6/2009 |
| WO | 2009100856 | A1 | 8/2009 |
| WO | 2010049020 | A1 | 5/2010 |
| WO | 2014139719 | A1 | 9/2014 |
| WO | 2015049319 | A1 | 4/2015 |
| WO | 2018219870 | A1 | 12/2018 |

OTHER PUBLICATIONS

Van De Kerkhof et al., "Full optical column characterization of DUV lithographic projection tools", Proceedings of SPIE—The International Society for Optical Engineering, May 2004, 12 pages.
Korean Notice of Allowance, with English translation, Dispatch No. 9-5-2026-009985735, Jan. 28, 2026, 4 pages.

* cited by examiner

Fig. 2

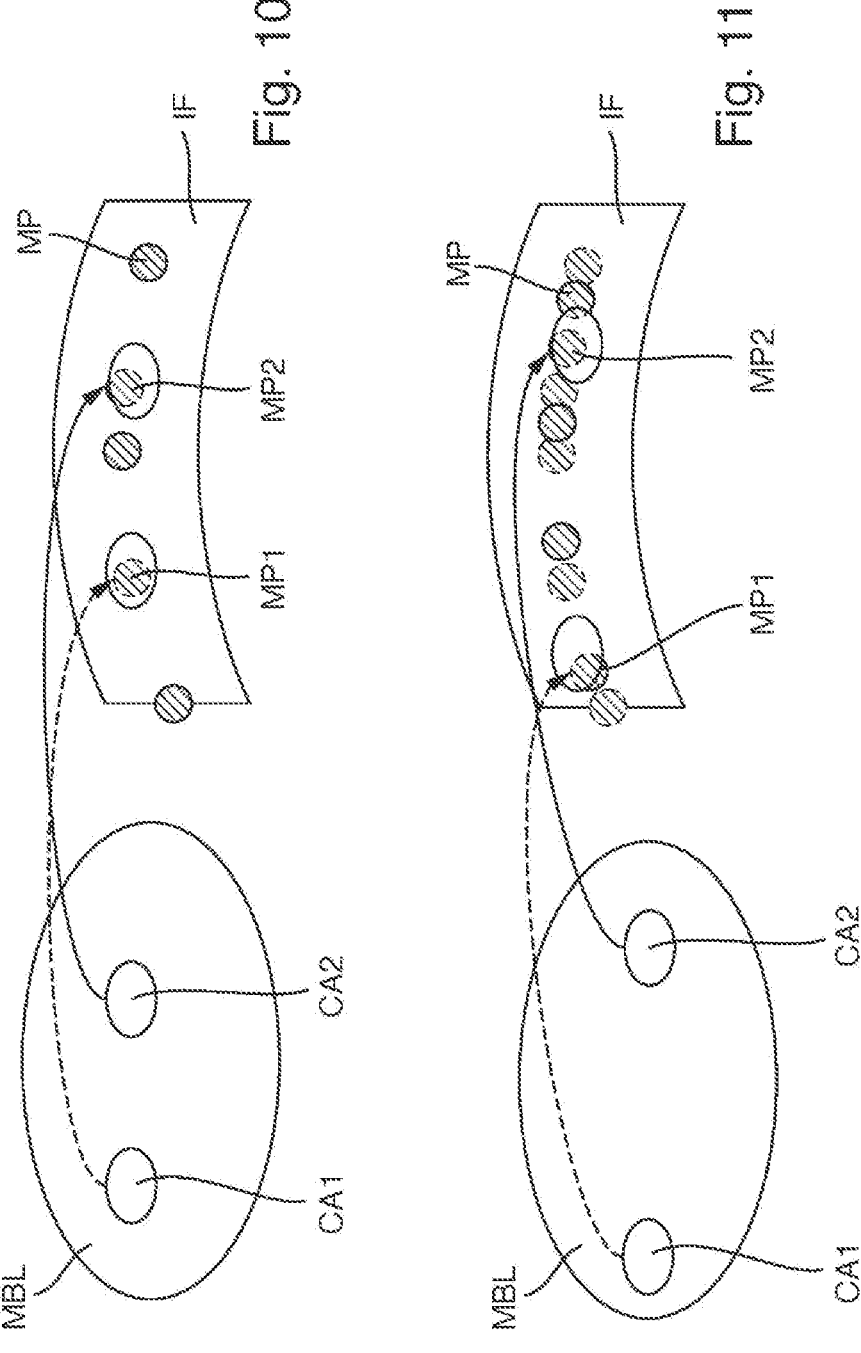

METHOD OF SETTING UP A PROJECTION EXPOSURE SYSTEM, A PROJECTION EXPOSURE METHOD AND A PROJECTION EXPOSURE SYSTEM FOR MICROLITHOGRAPHY

CROSS REFERENCE TO RELATED APPLICATIONS

This is a Continuation of International Application PCT/EP2021/050977 which has an international filing date of Jan. 19, 2021, and the disclosure of which is incorporated in its entirety into the present Continuation by reference.

FIELD OF THE INVENTION

The invention relates to a method of setting up a projection exposure system for exposing a radiation sensitive substrate with at least one image of a pattern of a mask. The invention further relates to a projection exposure method and a projection exposure system for microlithography.

BACKGROUND

Microlithographic projection exposure methods and systems are used predominantly for producing semiconductor components and other finely patterned components. These methods involve the use of masks (photomasks, reticles) or other patterning devices that bear or form the pattern of a structure to be imaged, e.g. a line pattern of a layer of a semiconductor component. The pattern is positioned in a projection exposure system in the beam path between an illumination system and a projection lens such that the pattern lies in the region of the object plane of the projection lens.

A substrate to be exposed, for example a semiconductor wafer coated with a radiation-sensitive layer (resist, photoresist), is held in such that a radiation-sensitive surface of the substrate is arranged in the region of an image plane of the projection lens, said image plane being optically conjugate with respect to the object plane. During an exposure process, the pattern is illuminated with the aid of the illumination system, which, from the radiation of a primary radiation source, shapes illumination radiation which is directed onto the pattern. The illumination radiation may be characterized by specific illumination parameters and impinges on the pattern within an illumination field of defined shape and size. The radiation altered by the pattern passes as projection radiation through the projection lens, which projects, or images, the pattern onto the substrate to be exposed. The image is generated in the image field of the projection lens.

One of the objectives in the development of projection exposure systems and methods is to produce structures having increasingly smaller dimensions on the substrate by lithography. Smaller structures lead to higher integration densities e.g. in the case of semiconductor components, which generally has a favorable effect on the performance of the micro-structured components produced.

The size of the structures that can be produced is crucially dependent on the resolving power of the projection lens used and can be increased by reducing the wavelength of the projection radiation that is used for the projection and/or by increasing the image-side numeral aperture NA of the projection lens that is used in the process. Imaging aberrations typically limit the capability to faithfully reproduce these ever finer structures.

Projection lenses for microlithography generally comprise a plurality of optical elements in order to account for stringent requirements with regard to the correction of imaging aberrations. Refractive and catadioptric imaging systems operating in the DUV (deep ultraviolet) or VUV (vacuum ultraviolet) wavelength range are often used. Those systems typically have ten or more transparent optical elements. In catadioptric systems transparent optical elements are combined with at least one imaging mirror, such as a concave mirror. Electromagnetic radiation from the extreme ultraviolet range (EUV), in particular having operating wavelengths in the range of between 5 nm and 30 nm, is also used. Radiation from the extreme ultraviolet range (EUV radiation) however cannot be focused or guided by refractive optical elements, since the short wavelengths in the EUV range are absorbed by the known optical materials that are transparent at higher wavelengths. Mirror systems (catoptric systems) are therefore used for EUV lithography. The masks used are reflective masks. In systems for EUV lithography, the system designers endeavor to manage with the fewest possible number of reflective elements, e.g. with four or six mirrors.

A projection lens necessarily exhibits intrinsic imaging aberrations on account of its optical design and production. Imaging aberrations can also occur during the period of the use, e.g. during the operation of a projection exposure system by the user. Such imaging aberrations are often caused by alterations of the optical elements incorporated in the projection lens as a result of the projection radiation used in operation. By way of example, a certain portion of said projection radiation can be absorbed by the optical elements in the projection lens. The absorption of the projection radiation can lead to heating of the optical elements, as a result of which, in the optical elements, a surface deformation and, in the case of refractive elements, a change in refractive index can be brought about directly and indirectly through thermally induced mechanical stresses. Changes in refractive index and surface deformations lead, in turn, to alterations of the imaging properties of the individual optical elements and hence also of the projection lens overall. This problem area is often dealt with under the key words "lens heating".

Other internal or external perturbations can also lead to deterioration of the imaging performance. They include, inter alia, a possible scale error of the mask, alterations of the air pressure in the surroundings, differences in the strength of the gravitational field between the location of the original lens adjustment and the location of use by the customer, changes in refractive index and/or form alterations of optical elements on account of material alterations as a result of high-energy radiation (e.g. compaction), deformations on account of relaxation processes in holding devices, drifting of optical elements and the like.

Attempts are usually made to at least partly compensate for imaging aberrations that occur during the service life, in particular the imaging aberrations that occur during operation.

Many state-of-the-art lithography exposure systems for highest resolutions rely on aberration measurements during production. The results of aberration measurements indicate changes in the optical performance of the projection lens which can be induced, e.g., by thermal effects.

The imaging aberration level may vary between different field points in the image field. As a consequence measuring systems are preferred which are capable of measuring at least one property of the projection radiation relevant for imaging quality or aberration level, respectively, by acquiring measuring data at a plurality of spaced apart measuring points distributed in the image field.

The article by M. van de Kerkhof et al., "Full optical column characterization of DUV lithographic projection tools" in: Proceedings of SPIE—The International Society for Optical Engineering·May 2004, DOI: 10.1117/12.536331 discloses that a phase measurement interferometer hardware (ILIAS™: Integrated Lens Interferometer At Scanner) integrated into high-NA ArF lithographic projection tools may be utilized to measure and control critical performance. A primary functionality of the ILIAS™ system is to measure and analyze wavefront aberrations across the full image field with high accuracy and speed. The speed of the ILIAS™ measurement allows for high density sampling of aberrations over the full exposure slit. Measurements performed on a 5×13 grid of measuring points in the image field (see FIG. 4 and FIG. 5) are reported to give a comprehensive overview of the aberrations over the entire imaging field, while the total measurement time is still within one hour. A Fast Mode is also described, which further reduces measurement time without significant loss of repeatability. The Fast Mode provides a total full field measurement (at a reduced grid of 1×5 points) within 15 seconds.

High-productivity projection exposure systems for microlithography comprise an operating control system which makes it possible to perform a fine optimization of imaging-relevant properties of the projection exposure system in reaction to environmental influences and other perturbations.

An operating control system typically comprises at least one manipulator operatively connected to an optical element of the projection exposure system to modify imaging properties of the projection exposure system. Corrections may be based on measurement results generated by the measuring system.

The manipulators (one or more) may be used to at least partly compensate for imaging aberrations. In the present application, the term "manipulator" denotes, inter alia, opto-mechanical devices that are designed to act, on account of corresponding control signals of an operating control system, actively on individual optical elements or groups of optical elements in order to alter the optical effect thereof, in particular to alter it such that an aberration that occurs is at least partly compensated for. The term "manipulator" also encompasses devices which, on account of corresponding control signals of an operating control system, act on the mask or on the substrate in order, for example, to displace, to tilt and/or to deform the mask or the substrate. A manipulator can be designed e.g. for decentering an optical element along or perpendicular to a reference axis, tilting an optical element, locally or globally heating or cooling an optical element, and/or for deforming an optical element.

As mentioned earlier, the level of imaging aberrations is not uniform across the entire image field in most cases. Instead, an imaging aberration level may vary between different field points in the image field. This variation may be described by a field-dependent aberration pattern.

A successful correction relies on sufficient information on the field-dependent aberration pattern to be corrected. Generating this information by measurements is expensive, however. A measuring operation should acquire measuring data at a plurality of spaced apart measuring points distributed in the image field. Data for field points located between measuring points may be obtained by interpolation.

Each measuring step performed at a measuring point takes time. If a measuring system is capable of measuring at different measuring points in parallel, there is typically a limit to the number of field points that can be measured in parallel.

In some metrology systems, such as e.g. ASMLs ILIAS™, the wafer exposure needs to be suspended. Correspondingly, the greater the number of measurements taken, the less throughput can be achieved.

SUMMARY

It is an object of the present invention to provide a method of setting up a projection exposure system which improves throughput of exposed substrates while maintaining at the same time a high level of imaging quality or sufficiently low level of imaging aberrations, respectively. It is a further object to provide a projection exposure method and a projection exposure system capable of performing projection exposures with improved throughput and high imaging fidelity under various conditions of use.

In order to solve these and other problems, the invention provides a method of setting up a projection exposure system as claimed and described herein. Further, the invention provides a projection exposure method as well as a projection exposure system as claimed and described herein.

Advantageous developments are specified in the dependent claims. The wording of all of the claims is incorporated by reference in the content of the description.

A contribution to the solution is to provide ways to measure as little as possible to obtain the field dependent aberration information in a level of precision sufficient to control the systems manipulators.

The inventors have recognized that in many practical cases an individual choice of measuring point distribution (also denoted as metrology pattern in this application) may be preferable in terms of required measuring time to prior art predefined standard measuring point distributions.

In many cases, the metrology pattern may be independent on the individual projection exposure system (same measuring point distribution for all systems of a given type) as the optical design is common to all machines of a given type and the expected use cases and their corresponding aberration patterns may also be more or less the same among the systems. On the other hand, the materials used for the individual projection lens may differ slightly from system to system. As will be shown in the embodiments, that difference alone can motivate an individual choice for the metrology pattern. Further, expected use cases of a certain projection exposure system may vary from end user to end user and/or from production cycle of a first product to production cycle of a different second product. The invention takes into account such variability and allows determining customized measuring point distributions. An optimized placement of measuring points can be defined which gives, for the individual projection exposure system, the best or at least a very good compromise between measurement accuracy and throughput loss due to the time required to measure a certain number of field points.

In one formulation of the invention, the method includes the step of determining, in a measuring point distribution calculation, a measuring point distribution.

In the context of this application, a measuring point distribution defines a number and the positions of measuring points to be used in a measurement. A measuring point may also be denoted as measurement point and denotes a point at which measuring data may be acquired. In other words: a measuring point is a point (very small area) in space where a measurement is performed.

The measuring point distribution calculation is performed under boundary conditions. The boundary conditions represent at least the following:

(i) Manipulation capacities of the operating control system. The manipulation capacities basically describe the capabilities of the operating control system to change the aberration amount and distribution by using the manipulators.

(ii) Measuring capacities of the measuring system. The measuring capacities include information about the number and local distribution of potential measuring points to determine aberration amount and distribution.

(iii) Predefined use case scenarios. The use case scenarios define a set of representative use cases. Each use case corresponds to a specific aberration pattern generated by the projection exposure system under a predefined set of use conditions.

In an embodiment, the measuring point distribution calculation comprises the step of calculating, for all manipulators and a number of field points, a relationship between a defined actuating value change at a manipulator and a resultant effect on aberration at each of the field points. The data resulting from this calculation may be represented in a matrix notation denoted as "dependency matrix A" in the present application. The meaning of "dependency" may be understood as follows.

A manipulator contains one or a plurality of actuating elements or actuators. An actuating value of each actuator can be changed or adjusted with control signals of the operating control system. An actuating value change may involve, for example, a movement of an actuator, e.g. in order to displace or tilt an optical element of the projection lens or to tilt or displace the mask bearing a pattern and/or the substrate to be exposed. An actuating value change may also involve a temperature change (thermal manipulator) or a change in an electrical voltage. Changing an actuating value of an actuator of a manipulator generally changes or alters the imaging property of the optical system since the manipulator acts on an element interacting with the radiation beam.

The influence of a change of actuating value at a manipulator can be calculated. As mentioned above, the relationship between a defined actuating value change at a manipulator and the resultant effect on lithographic aberrations is denoted by the term "dependency" in the present application. This relationship may also be denoted as "sensitivity". In order to quantify the effect on aberrations at each of the field points, an aberration pattern (local distribution of aberration over the field points) may be decomposed with respect to a system of base functions so that an aberration pattern is represented by coefficients in terms of the base functions. For a pupil function or wavefront aberrations, the Zernike polynomials are typical examples of a base function. For field coordinates, often Legendre polynomials or the like are used. The level of precision in quantifying a certain aberration is usually higher the higher the number of considered base functions is. The number of considered base functions will be denoted by character $Z$ in this application.

Each manipulator provides one or a plurality of manipulation degrees of freedom. For example, if a manipulator is designed to generate rigid body movements of an optical element, such as a mirror or a lens, the number of manipulation degrees of freedom may be six (translations in x, y and z direction, rotations about x, y and z-axis). The total number of manipulation degrees of freedom is usually large compared to the number of manipulators in a system.

When $M$ is the number of all manipulation degrees of freedom considered in the calculation and $F$ is the number of field points for which the calculation is performed, the dependency matrix A will have a first dimension $M$ and a second dimension given by the product $F*Z$. Calculating a dependency matrix is found to be very helpful in the context of describing the manipulation capacities of the operating control system. Certain field points may be particularly suited to identify the effects of even minor changes when a manipulator setting is changed. Those field points are more "sensitive" in that they exhibit a relatively stronger dependency than others. In contrast, other field points may be more or less "blind" for a particular actuating value change. The information about more sensitive and "blind" field points is contained in the dependency matrix.

According to an embodiment, the measuring point distribution calculation comprises the step of calculating, for a number $M$ of manipulation degrees of freedom, a number $M^*$ of correction degrees of freedom of the operating control system, wherein the condition $M^* \leq M$ holds. This calculation step considers the fact that, in some cases, an aberration change caused by a certain change of actuating value at a certain manipulator can also be brought about by a combination of two or more actuating changes of other manipulators. Therefore, the number of correction degrees of freedom may be smaller than the number of manipulation degrees of freedom actually available in the operating control system. Parameter $M^*$ may be described as the number of manipulation degrees of freedom which are linearly independent from each other.

As an example, one might consider a manipulator decentering a reticle in a scan direction of a scanner system by a certain amount. This will be equivalent in effect to a manipulator decentering the wafer by the amount scaled by the scale factor of the optical system (projection lens). Therefore, either one of the manipulators will be superfluous to the system's correction degrees of freedom.

In a preferred embodiment, determining the number $M^*$ of correction degrees of freedom is performed by determining the rank of the dependency matrix A so that the condition $M^* = \mathrm{rank}\,(A)$ holds. The calculation can be performed with high precision and speed.

The step of determining measuring capacities of the measuring system includes determining the number and the local distribution of potential measuring points available in the particular measuring system. This step considers possible physical and/or structural restrictions due to the layout of a sensor of the measuring system, for example. Character $F$ is used herein to denote a predefined set of field points which can potentially be used for measurements. Field points actually available for a measurement may not be indefinitely close to each other, but have a certain minimum distance from each other. A local distribution $F$ of potential measuring points may sometimes be described by a regular grid where neighboring measuring points are equidistantly spaced from each other, e.g. in mutually perpendicular directions.

The step of determining measuring capacities of the measuring system may include determining possible measuring positions in the set $F$ of field points and a maximum number $F^*$ of measuring positions which can be measured simultaneously. The number $F^*$ may be smaller than the total number of potential measuring points in set $F$ due to (physical) restrictions of the measuring system. The measuring point distribution calculation may further comprise the step of defining a reduced number $f$ of measuring points and identifying, for this number of field points, those field points exhibiting a largest effect of an actuating value change at a manipulator on the aberration level. Typically, the reduced number f is smaller than F*, where F* is the number of field points actually usable as a measuring point in a measuring step. A measuring step may include measuring at considered measuring points simultaneously or one after the other (sequentially) in one measuring operation. The reduced number f≤F* is the number of field points actually needed considering the existing dependencies. The field points in the reduced set may include the best positions for placing a measuring point when only a limited number of measuring points is available. The determination may include calculations determining situations where the Eigenvalues in dependency matrix are largest.

In one formulation an aspect of the invention may be described such that the algorithm applied in a measuring point distribution calculation is designed so as to keep f as small as possible under a given set of considered boundary conditions.

The measuring point distribution calculation is performed under a boundary condition considering predefined use case scenarios. This step includes, in an embodiment, the step of defining a set of representative use cases, wherein each of the use cases corresponds to perturbations generated under a predefined set of use conditions; determining for each of the use cases, a representative aberration pattern; decomposing the aberration pattern with respect to a system of base functions so that an aberration pattern is represented by coefficients in terms of the base functions; and calculating a change in coefficients at a set of field points F for all manipulation degrees of freedom.

In most cases the definition of a set of predefined use case scenarios will be performed based on considerations made during the developmental phase, or design, of the projection exposure system, i.e. before the projection exposure system is delivered to a first end user.

The optical design (i.e. the general layout of an optical system) of many projection lenses used in lithography projection exposure systems exhibits several symmetries, such as symmetry of flip of optical elements used in operation with respect to certain axes or planes. The term "symmetry of flip" shall be synonymous to "mirror symmetry" or "reflection symmetry"). The optical design determining the performance may be described by number, types, surface shapes (spherical, aspherical with or without rotational symmetry), positions of optical surfaces guiding the light, aperture size and position, positions of mask and substrate, field shape and size, intended etendue, etc). Due to the symmetry of the optical design it might be expected that the positions of representative measuring points will also reflect such symmetries. For example, the image field may exhibit mirror symmetry with respect to a line of mirror symmetry. Such mirror symmetry is typically found in many systems with rectangular image field or ring-shaped (arcuate) image field, such as those typical of EUV projection exposure systems. A mirror symmetric placement of measuring points may be used. Basically, with a line of mirror symmetry running in a y-direction, this means that if a measuring point is placed at a co-ordinate (x, y), then there will also be a corresponding (mirror related) measuring point at (−x, y). In a scanning system, the y-direction may denote the scan direction and the x-direction is perpendicular to the scan direction in the image field.

A more detailed analysis, however, has revealed that such mirror symmetric placement of measuring points is not necessarily the best in all cases. Surprisingly, in many embodiments there is an image field which exhibits mirror symmetry with respect to a line of mirror symmetry and the method comprises determining a measuring point distribution which is asymmetric with respect to the line of mirror symmetry. The term "asymmetric measuring point distribution" particular denotes a measuring point distribution wherein there is at least one measuring point at (x, y) and no corresponding measuring point at (−x, y).

In some cases, the pattern of measuring points in the measuring point distribution may be subdivided into a first group of measuring points which form a symmetric pattern symmetric to the line of mirror symmetry, and a second group including one or more measuring points which do not have a corresponding measuring point at a mirror related position. In some embodiments, there is only one such measuring position in the second group in addition to measuring points of the first group which are symmetry related to each other.

A non-symmetric (asymmetric) measuring point distribution may also be favorable in view of the correction capability of manipulators in the projection exposure system, while generally it does not mean that the layout of manipulators themselves breaks the symmetry of the system. However, an optimum distribution of measuring points may be based on the knowledge that the projection exposure system has a given set of correction symmetries, such as flip symmetry with respect to the y-axis. In that case, sometimes measurements performed on mirror related measuring points on both sides of the line of mirror symmetry would be redundant. Instead, it may be favorable to measure at one or more measuring points having no mirror related measuring point partner in order to gain additional information on the nature of the aberration pattern.

There are at least two possible advantages that can be obtained applying an asymmetric measuring point distribution. Firstly, for a system that is asymmetric in its imaging properties, an asymmetric distribution of measuring points may capture the variation better than a symmetric distribution of measuring points. This may allow measuring more where the variation is largest, thereby improving significance of the measured data. Secondly, for a system that is strictly symmetric in its imaging properties, an asymmetric distribution of measuring points can avoid redundancy and the number of measuring points can be reduced to increase throughput.

In some embodiments optical simulation provides information about those locations in the image field where a local maximum of an absolute value of an aberration would be expected in a certain use case. It is considered useful to place measuring points at least in those locations where a local maximum of the absolute values of aberrations is expected based on the simulation.

It is expected that measurements at those critical locations indicate very early in the process whenever the level of aberration raises upon use of the optical system so that correcting manipulations can be initiated at an early stage, thereby ensuring that the total aberration level over the whole image field stays below a given threshold.

In some cases, a measuring point distribution calculation is performed upon an initial setup of the projection exposure system. The calculation will typically be done on the original manufacturer side, e.g. at the premises of the original manufacturer, before the exposure system is delivered to a first end user. The initial setup may be the only setup sufficient to obtain good performance over the service life time.

Alternatively, or in addition, a measuring point distribution calculation may be performed while the exposure system is in use at a site of the manufacturer. One or more measuring point distribution calculations may be made after an initial setup during the service life time. The measuring point distribution calculation may be made depending on the next use case to be used in a projection exposure system. This may be particularly advantageous where an end user wishes to use proprietary mask structures and/or proprietary illumination modes.

A measuring point distribution calculation may provide one single measuring point distribution best adapted to the layout of the projection exposure system and multiple different use cases.

If desired, a predefined set including multiple differing measuring point patterns (differing measuring point distributions) may be provided, where an end user may select between the pre-calculated patterns selected based on the actual use case for which the exposure system is to be used.

Some embodiments allow the measurement positions (measuring point distributions) to be dynamically adapted to the active use case during production on the end users site. A corresponding measuring system is configured to acquire measuring data selectively at a plurality of spaced apart measuring points distributed in the image field according to two or more different measuring point distributions. A first measuring point distribution adapted to specific conditions of a first use case may be selected in a first use case and a second measuring point distribution adapted to specific conditions of a second use case may be selected for a second use case providing conditions different from the first use case.

In some embodiments measurements are performed for two or more or all measuring points of a measuring point distribution in parallel. Measuring time may be saved by parallel measurements. It is also possible to acquire measuring data at two or more or all measuring points of a measuring point distribution sequentially, i.e. one after the other. While this may be more time consuming data processing may be easier and accuracy higher than in parallel measurements.

A capability to select and switch between two or more different measuring point distributions may be useful in many situations.

For example, if thermal aberrations need to be compensated, x dipole illumination will often produce hot regions of optical elements at (in x direction) outer positions compared to y dipole illumination, where (again in x direction) those hot spots will be situated closer to the center. As a result, in the field dependency of some Zernike wavefront aberrations in the x dipole case higher values are expected closer to the field edge, whereas in the y dipole case the inner field regions will typically exhibit larger Zernike amplitudes. Accordingly, it may be preferable using measurement positions in the x dipole case closer to the field edge, compared to the y dipole case, where measurement positions in the inner region are likely to yield the most relevant information.

Drift effects in lenses may be another source of aberrations, which can appear short term as well as long term. Typical exposure systems work in vacuum, whereas maintenance normally is performed under ambient atmosphere conditions in the factory. Therefore, short term drift effects may appear after maintenance since some materials absorb humidity from the air and release it when arranged back under vacuum conditions. Thermal effects might occur as incoming air sometimes is not fully conditioned. As a result, short term drift over several hours or even over a few days may be visible in the aberration field variation.

Component swap may be another possible cause for changes in aberration finger prints. In order to optimally correct for these short term contributions, an adaption of the measurement positions to those where drift or swap effects are particularly strong sometimes may be beneficial, as amplitude and rate of drift effects as well as the lens state after swap are not fully predictable. Where potential drift causes, such as e.g. exposed bushes or other mounting structures at optical elements, and the swap positions are known, an optical effect of changes there can be simulated and the relevant measuring positions likely to yield best results can be identified.

Long term drift effects can occur, e.g., as a result of compaction, contamination or other degradation locally in scanner components in the course of several months or years. They are more difficult to predict, but can be recognized, e.g., by full field measurements. If the aberration margin at certain field positions is reduced particularly strongly over time, it may be beneficial to observe such positions by more frequent measurements in order to keep the system in specification. In a correction scheme, those positions may be attributed a higher correction weight.

The invention also relates to a projection exposure method for exposing a radiation sensitive substrate with at least one image of a pattern. The method comprise: generating illumination radiation directed onto the pattern in an illumination field; projecting a part of the pattern lying in the illumination field onto an image field at the substrate with projection radiation using a projection lens comprising a plurality of optical elements; measuring at least one property of the projection radiation representing an aberration level at a plurality of spaced apart measuring points distributed in the image field in accordance with a measuring point distribution defining a number and positions of measuring points to be used in a measurement using a measuring system; and modifying imaging properties of the projection exposure system based on measurement results generated by the measuring system by an operating control system comprising at least one manipulator operatively connected to an optical element of the projection exposure system. Therefore, performance of the exposure process can be optimized by setting appropriate manipulators based on measurements performed with spatial resolution in the image field.

According to one formulation the method comprises the steps:

performing, in a first use case, a first exposure by illuminating a first pattern with illumination radiation according to a first illumination setting;

reconfiguring the exposure system from a first configuration adapted to the first use case to a second configuration adapted to a second use case different from the first use case;

performing, in the second use case, a second exposure by illuminating a second pattern with illumination radiation according to a second illumination setting;

determining for each of the first use case and the second use case a corresponding first measuring point distribution and second measuring point distribution;

measuring the at least one property of the projection radiation separately for each of the first and second use case at measuring points distributed according to the first measuring point distribution and second measuring point distribution and modifying imaging properties of the projection exposure system separately for the first and second use case based on measurements performed based on the first measuring point distribution and the second measuring point distribution, wherein the measuring system is reconfigured upon changing from the first use case to the second use case such that the second measuring point distribution differs from the first measuring point distribution.

According to this formulation the measuring point distribution is modified as the user reconfigures the exposure system from a first configuration used in the first use case to a changed (second) configuration used in the second use case. For example, a first mask providing the first pattern maybe used in the first use case while another mask (second mask) providing a second pattern different from the first pattern is used in the second use case (mask change). Typically, as the patterns differ, appropriate illumination settings also differ. The measuring point distribution best adapted for each of the use cases may be selected from a pre-calculated set of different measuring point distributions, or may be calculated "freshly" based on the parameters set on the exposure system.

In many cases the image field exhibits mirror symmetry with respect to a line of mirror symmetry. In some embodiments at least one of the first and second measuring point distributions is asymmetric with respect to the line of mirror symmetry. Potential benefits of asymmetric metrology patterns are described elsewhere in this application.

An asymmetric measuring point distribution may be beneficial independent of whether or not the exposure system is reconfigured between different use cases.

The invention also relates to a projection exposure system for exposing a radiation sensitive substrate with at least one image of a pattern, the projection exposure system comprising:

an illumination system configured to generate illumination radiation directed onto the pattern in an illumination field;

a projection lens comprising a plurality of optical elements configured to project a part of the pattern lying in the illumination field onto an image field at the substrate with projection radiation, a measuring system capable of measuring at least one property of the projection radiation representing an aberration level at a plurality of spaced apart measuring points distributed in the image field according to at least two different measuring point distributions, a measuring point distributions defining a number and positions of measuring points to be used in a measurement;

an operating control system comprising at least one manipulator operatively connected to an optical element of the projection exposure system to modify imaging properties of the projection exposure system based on measurement results generated by the measuring system;

a measuring point distribution determination system configured to determine a measuring point distribution defining a number and positions of measuring points to be used in a measurement, specific for a use case.

The determination may be based on a selection made from a predefined set of different pre-calculated measuring point distribution adapted to specific use case scenarios. Alternatively, the determination may include a calculation under boundary conditions of a use case. The measuring system may be capable of measuring different measuring points sequentially or two or more or all measuring points simultaneously, i.e. in parallel.

Embodiments of the invention may be used in connection with different types of projection exposure systems. A projection exposure system may include a refractive and catadioptric imaging system operating in the DUV (deep ultraviolet) or VUV (vacuum ultraviolet) wavelength. Those systems typically have ten or more transparent optical elements. In catadioptric systems transparent optical elements are combined with at least one imaging mirror, such as a concave mirror. Alternatively, reflective projection exposure systems adapted to electromagnetic radiation from the extreme ultraviolet range (EUV), in particular having operating wavelengths in the range of between 5 nm and 30 nm, may be used.

The above features and further features emerge not only from the claims but also from the description and from the drawings, wherein the individual features can in each case be realized by themselves or a plurality in the form of sub-combinations in an embodiment of the invention and in other fields and can constitute advantageous and inherently protectable embodiments. Exemplary embodiments of the invention are illustrated in the drawings and explained in greater detail below.

BRIEF DESCRIPTION OF DRAWINGS

FIG. 2 shows a flowchart including steps in an embodiment of a routine to systematically calculate a measuring point distribution;

FIGS. 9A, 9B and 9C show three different examples of measuring point distributions, wherein FIG. 9A shows a reference distribution of measuring points, FIG. 9B shows a reduced number of measuring points, and FIG. 9C shows measuring positions varied with respect to those of FIG. 9B;

FIGS. 10 and 11 show different examples of how the local distribution of measuring points may be adapted to account for specific distributions of inhomogeneities in a material blank;

DETAILED DESCRIPTION

In the following, concepts and aspects of inventions and embodiments thereof disclosed in this application will be described using a EUV microlithography projection exposure system as an example. A skilled person recognizes that the examples are not limiting. For example, the concepts may also be used in connection with systems working in other wavelength ranges, such as DUV systems.

Figure 1A:
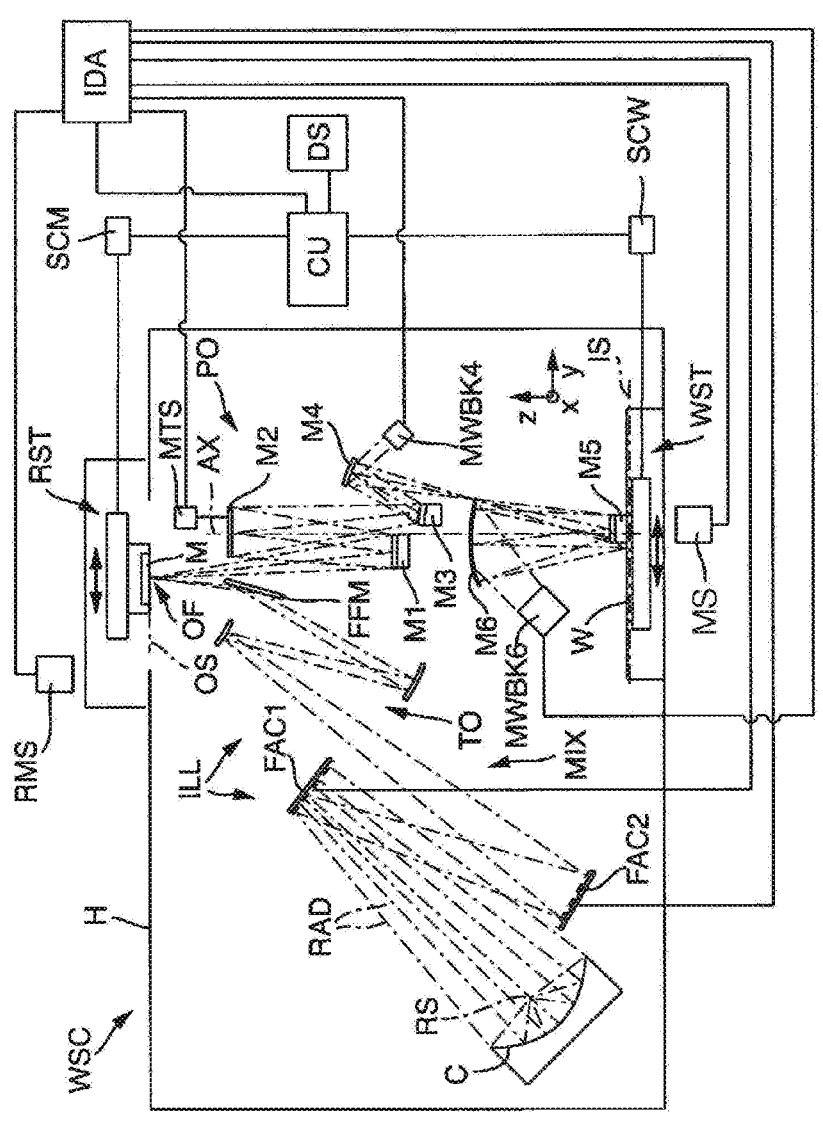
FIG. 1A, 1B, 1C show components of an EUV microlithography projection exposure system according to an embodiment, first in an overall view (FIG. 1A), next with emphasis on the system's manipulator system, and then with focus on the arcuate shapes of the object and image fields of the system's projection objective.
Figure 1B:
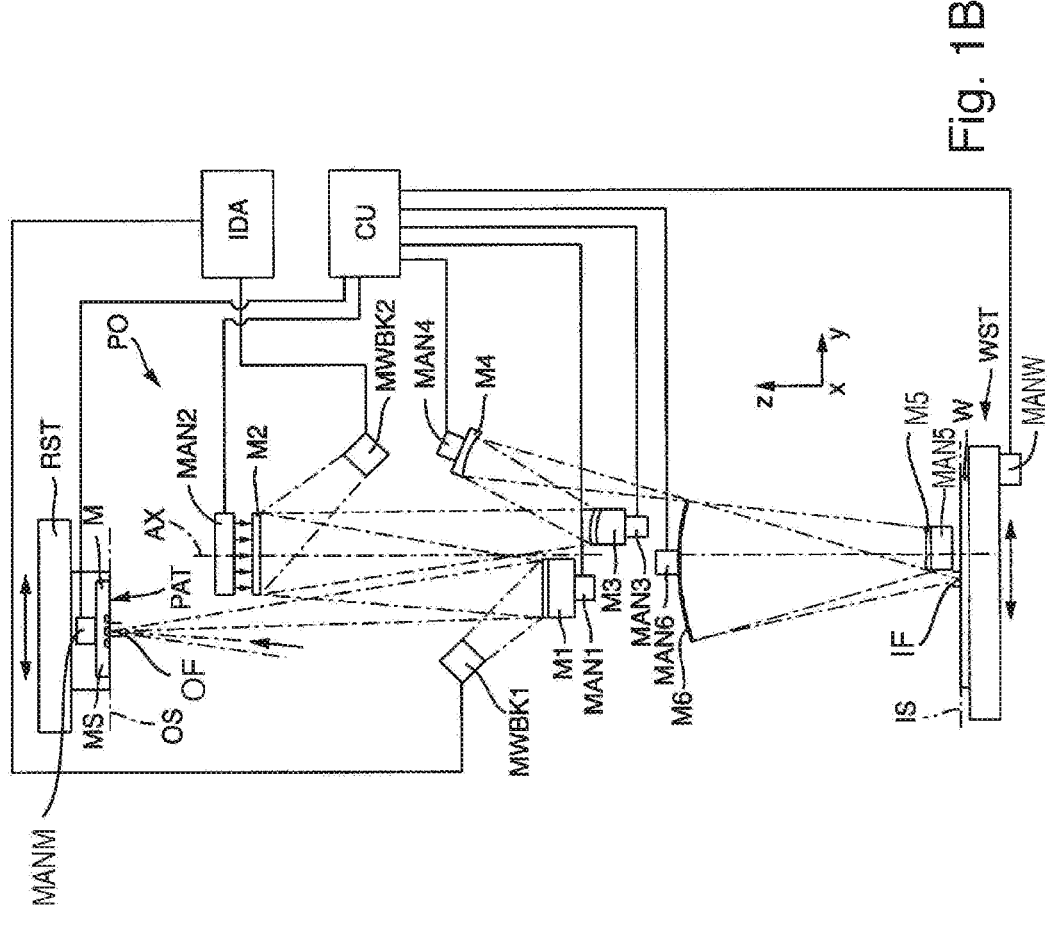

FIGS. 1A and 1B show components of an EUV microlithography projection exposure system WSC for exposing a radiation-sensitive substrate W arranged in the region of an image plane IS of a projection lens PO, with at least one image of a pattern of a reflective mask M, said pattern being arranged in the region of an object plane OS of the projection lens.

The projection exposure system is operated with the radiation of a primary radiation source RS. An illumination system ILL serves for receiving the radiation of the primary radiation source and for shaping illumination radiation directed onto the pattern PAT. The projection lens PO serves for imaging the structure of the pattern onto the light-sensitive substrate W.

The primary radiation source RS can be, inter alia, a laser plasma source or a gas discharge source or a synchrotron-based radiation source. Such radiation sources generate radiation RAD in the extreme ultraviolet range (EUV range), in particular having wavelengths of between 5 nm and 15 nm. In order that the illumination system and the projection lens can operate in this wavelength range, they are constructed with components that are reflective to EUV radiation.

The radiation RAD emerging from the radiation source RS is collected by a collector C and guided into the illumination system ILL. The illumination system comprises a mixing unit MIX including a field facet mirror FAC1 and a pupil facet mirror FAC2, a telescope optical unit TO and a field forming mirror FFM. The illumination system shapes the radiation and thus illuminates an illumination field situated in the object plane OS of the projection lens PO or in proximity thereto. In this case, the shape and size of the illumination field determine the shape and size of the effectively used object field OF in the object plane OS (see FIG. 1C). The illumination field is generally in the shape of a slot having a high aspect ratio between width (in x-direction) and height (in y-direction).

During operation of the system, a reflective mask M is arranged in the object plane OS. The projection lens PO here has six mirrors M1 to M6 and images, or projects, the pattern of the mask into the image plane on a reducing scale, the substrate to be exposed, e.g. a semiconductor wafer, being arranged in said image plane.

The spatial (local) illumination intensity distribution at the field facet mirror FAC1 determines the local illumination intensity distribution in the object field OF. The spatial (local) illumination intensity distribution at the pupil facet mirror FAC2 determines the illumination angle intensity distribution in the object field OF.

A unit RST for holding and manipulating the mask M (reticle) is arranged such that the pattern PAT arranged on the mask lies in the object plane OS of the projection lens PO, said object plane here also being designated as the reticle plane. The mask is movable in this plane for scanner operation in a scanning direction (y-direction) perpendicular to the reference axis AX of the projection lens (z-direction) with the aid of a scan drive SCM.

The substrate W to be exposed is held by a unit WST comprising a scanner drive SCW in order to move the substrate synchronously with the mask M perpendicularly to the reference axis AX in a scanning direction (y-direction). Depending on the design of the projection lens PO, these movements of mask and substrate can be effected parallel or antiparallel to one another.

The unit WST, which is also designated as "wafer stage", and the unit RST, which is also designated as "reticle stage", are part of a scanner unit controlled with a scanning control unit, which in the case of the embodiment is integrated into the central control unit CU of the projection exposure system. A data storage DS is associated with the control unit.

Figure 1C:
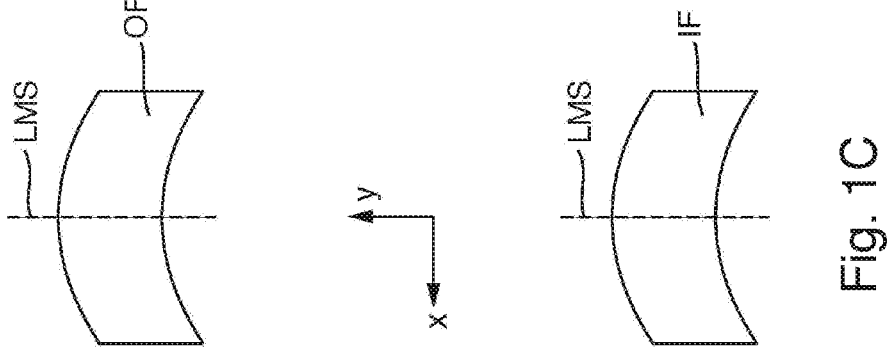

FIG. 1C shows schematically the arcuate shapes of the object field OF and the corresponding image field IF in the embodiment. The size of the image field IF is smaller than the size of the object field and related to the size of the object field OF by the reduction ratio provided by the projection lens. The object field OF and image field IF have a shape which is mirror symmetric with respect to a line LMS of mirror symmetry inherent to the projection lens. The line of mirror symmetry runs parallel to the y-direction, which corresponds to a scanning direction used in operation.

All optical components of the projection exposure system WSC are accommodated in a housing H which can be evacuated.

EUV projection exposure systems having a similar basic construction are known e.g. from WO 2009/100856 A1, WO 2010/049020 A1 or WO 2015/049319 A1, the disclosures of which are incorporated in their entireties by this reference into the content of this description.

Other embodiments may have different layouts. For example, the projection lens may have more than six mirrors, e.g. eight mirrors or ten mirrors or more. The reduction ratio need not be isotropic (i.e. the same in all direction in the field). Instead, the projection lens may have an anamorphotic design resulting in reduction ratios which differ between the scan direction and the cross scan direction.

The projection exposure system is equipped with a measuring system MS, which, in the embodiment, is designed to perform a measurement of the wavefront of the projection radiation which passes in the projection lens from the mask to the substrate to be exposed. A spatially resolving measurement for a plurality of field points on image surface level is possible. By way of example, it is possible to provide wavefront measuring systems of the type described in U.S. Pat. No. 7,333,216 A1 or U.S. Pat. No. 6,650,399 A1, the disclosures of which are incorporated in their entireties by this reference into the content of this description. The measuring system MS is a functional component of a system for intrinsic data acquisition. This system comprises a unit IDA for intrinsic data acquisition, to which one or a plurality of measuring and acquiring units can be connected. In addition to the wavefront measuring system, other systems for intrinsic data acquisition may be provided, such as disclosed e.g. in WO 2015/049319 A1.

The projection exposure system comprises an operating control system comprising a plurality of manipulators each operatively connected to an optical element of the projection exposure system (or another element arranged in the beam path) to modify imaging properties of the projection exposure system based on measurement results generated by the measuring system. Manipulators make it possible to alter (i.e. change) the imaging properties of the projection lens in a defined manner on the basis of control signals of the control unit CU. In this case, the term "manipulator" denotes, inter alia, optomechanical units designed for actively acting-on the basis of corresponding control signals-on individual optical elements or groups of optical elements in order to alter the optical effect thereof. In the embodiment, manipulators are set such that imaging aberrations which have been determined based on measurements can be reduced in a targeted manner. A manipulator can be designed e.g. for decentering an optical element along a reference axis or perpendicular thereto or for tilting an optical element. In this case, the manipulators bring about rigid-body movements of optical elements. Such manipulators may have six manipulation degrees of freedom, for example. It is also possible to heat or cool an optical element locally or globally with the aid of a thermal manipulator and/or to introduce a deformation of an optical element. For this purpose, a manipulator contains one or a plurality of actuating elements or actuators, the present actuating value of which can be changed or adjusted on the basis of control signals of the control system. Manipulators may also be provided in order to manipulate the mask and/or the substrate. For example a manipulator may be configured to displace, to tilt and/or to deform the mask and/or the substrate.

In embodiment working in the DUV wavelength range other and/or additional manipulators may be used, such as the operating wavelength provided by a (laser) light source and/or a composition and/or pressure of a gas filling interspaces between optical elements.

FIG. 1B shows by way of example a system of manipulators MAN1 to MAN6 which are assigned to the mirrors M1 to M6 of the projection lens PO and are in each case connected to the control unit CU. Each of the manipulators MAN1 to MAN6 allows rigid-body movements of the associated mirror, that is to say in particular a tilting, a displacement parallel to the reference axis AX and/or a displacement perpendicular to the reference axis AX. The second manipulator MAN2 associated with the second mirror M2 (optically in proximity to a pupil) is a deformation manipulator having a multiplicity of independently driveable actuators which allow the mirror surface of the second mirror to be deformed one-dimensionally or two-dimensionally. This may involve, for example, a thermal manipulator (mirror deformation through non-uniform heating) or a mechanical manipulator (mirror deformation through mechanical actuation).

In the embodiment, the manipulation system additionally comprises a mask manipulator MANM configured to manipulate the mask M and a substrate manipulator MANW configured to manipulate the substrate W.

The system for intrinsic data acquisition may include sensors (such as sensors MWBK1, MWBK2 etc.) monitoring the condition of the mirrors subject to manipulations so as to allow for a feedback control of manipulations.

In the following a description is provided of preferred embodiments of methods to set up and operate the projection exposure system. The methods consider that, in general, the level of imaging aberrations is not uniform across the entire image field IF. Instead, an imaging aberration level may vary between different field points in the image field. This variation may be described by a field-dependent aberration pattern. A successful correction relies on sufficient information on the field-dependent aberration pattern to be corrected. It is a goal to gather sufficient information on the field-dependent aberration pattern in a reasonable time. In other words, auxiliary process time for measurements shall be reduced so as to improve throughput (productive use) of the exposure system.

Figure 2:
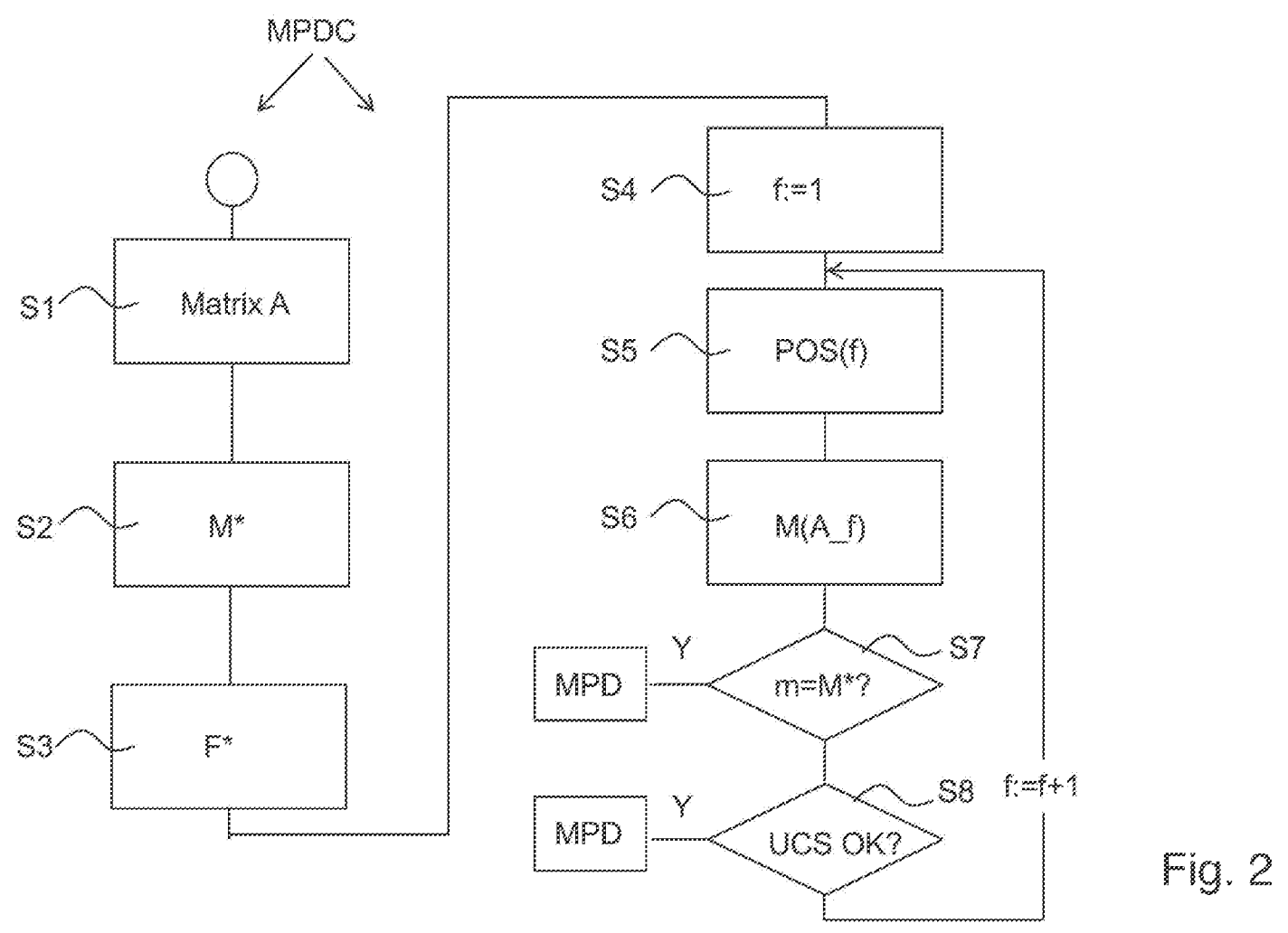

Next, a description is provided of a preferred routine to systematically calculate a measuring point distribution. FIG. 2 shows an exemplary flowchart of steps. The measuring point distribution calculation (MPDC) is performed under boundary conditions representing at least: (i) manipulation capacities of the operating control system (represented e.g. by degrees of freedom and their dependencies); (ii) measuring capacities (represented e.g. by number and local distribution of potential measuring points of the measuring system); and (iii) predefined use case scenarios defining a set of representative use cases. Each use case corresponds to a specific aberration pattern generated by the projection exposure system under a predefined set of use conditions. The following notation is used in this example:

M: Number of manipulation degrees of freedom

F: Given set of field points

A: Dependency matrix. The term "dependency" describes the relationship between a defined actuating value change at a manipulator and the resultant effect on the imaging quality or on lithographic aberrations. Dependencies can be included in a matrix comprising the change of Zernike coefficients at a given set of field points, F, for all manipulators M $M^*$: Number of correction degrees of freedom, usually $M^*<M$. $M^*$ can be calculated from dependency matrix A: $M^*=$rank (A). $M^*$ may be described as the number of manipulators which are linearly independent from each other.

$F^*$: Maximum number of field points that can be used simultaneously as measuring points (according to restrictions of the actual measuring system used)

f: Variable for number of measuring points (measuring positions) used for a calculation.

$A\_f$: reduced dependency matrix m: number of correction degrees of freedom according to a reduced dependency matrix A first step S1 of the calculation includes calculating the change in Zernike coefficients at a given set of field points F for all manipulation degrees of freedom (M) in the optical system. These dependencies are also denoted "dependency" in the present application. The term "dependency" describes the relationship between a defined actuating value change at a manipulator and the resultant effect on lithographic aberrations. The various dependencies may be represented in a dependency matrix denoted by letter A.

In a second step S2 a number $M^*$ of correction degrees of freedom of the system is calculated. Usually, the condition $M^*<M$ holds. This calculation step considers the fact that a certain aberration change caused by a given change of an actuating value at a certain manipulator could also be brought about by changing the actuating values of two or more other manipulators in combination. Therefore, this step is capable of reducing redundancies. Parameter $M^*$ thereby represents the number of manipulation degrees of freedom which are linearly independent from each other. Where the dependencies mentioned above (step S1) are represented in a dependency matrix A, the number $M^*$ of correction degrees of freedom may simply be calculated by calculating the rank of matrix A, i.e. $M^*=$rank (A).

A third step S3 considers the boundary conditions given by the measurement system available in the projection exposure system. In other words, the physical and functional restrictions of the metrology system are considered. In step S3 possible measuring positions in the set of field points F are considered and a maximum number F* of measuring positions is determined in view of the restrictions of the metrology system. Typically, the number F* is smaller than the number of field points in the given set F of field points.

These steps S1, S2 and S3 are useful to quantify the "hardware" available in the projection exposure system under consideration. The steps need not be performed in the given sequence, e.g. step S3 may be made concurrently or before step S2

The next steps are now performed based on these preparatory calculation steps. The next calculation steps help to find an optimum local distribution of measuring points under the boundary conditions imposed by the projection exposure system and in view of further boundary conditions.

In a fourth step S4, a current number of measuring positions f is set to a minimum number of possible measuring positions. In the example f:=1 is used as a starting number.

In the fifth step S5 the best positions POS (f) for exactly f measuring points are determined. Preferably, those measuring points are identified as those f field points which have the largest change in Zernike coefficients for the given manipulators. Practically, in a matrix based calculation, those field points can be identified as being those field points having the largest eigenvalues. According to the experience of the inventors, the resulting local distribution of the f measuring points may be symmetric in some cases and may be asymmetric in other cases.

In the sixth step S6 a number m of correction degrees of freedom is calculated for a system represented by a reduced dependency matrix A_f. The reduced dependency matrix A_f is a dependency matrix where only the change in Zernike coefficients at the best f positions is included for all manipulators in the optical system.

In the seventh step S7 the calculation determines whether or not the number m of correction degrees of freedom just calculated corresponds to the number M* of correction degrees of freedom calculated in the second step (S2). If m=M*, the calculation can be stopped. In this case, the calculated measuring point distribution MPD calculated in step S6 can be used as the measuring point distribution providing the best compromise under the boundary conditions considered in the previous steps.

If the seventh step S7 determines that the condition m #M* holds, the calculation routine proceeds to the eighth step S8. In the eighth step S8, further boundary conditions are considered. The eighth step S8 includes representations of predefined use case scenarios UCS defining a set of representative use cases, wherein each use case corresponds to a specific aberration pattern generated by the projection exposure system under a predefined set of use conditions. In the eighth step S8, the aberration level for the determined measuring points is calculated for all representative use cases considered in a preparatory step. If the overall aberration level for all predefined use case scenarios considered in this calculation step is acceptable (i.e. is within specification), the calculation can be terminated and the measuring points (or measuring point distribution MPD) determined in the seventh step S7 can be used.

If it is determined that the aberration level is not within specification for the measuring point distribution calculated in the eighth step S8, this can be taken as an indication that the starting number of the current number of measuring positions (number f in each calculation cycle) may not be sufficient to achieve specification. In that case, the current number of measuring positions (f) is increased by a predetermined increment, usually by one, so that the condition f:=f+1 holds. Based on the new value of f, the calculation cycle is repeated starting with the fifth step S5.

The calculation cycle is repeated until the eighth step S8 indicates that the aberration level is acceptable for the present number of measuring positions.

If the eighth step S8 determines that the condition f=F* is reached, then the calculation is stopped. The boundary conditions should then be re-evaluated to modify possible measuring positions and/or an available maximum number of measuring positions and/or the set of manipulators considered in the calculations.

Some problems addressed by the invention and preferred embodiments thereof may also be understood in view of the following explanations.

In another formulation, the approach includes determination of a suitable local distribution of measuring points (i.a. a measuring point distribution) actively used in a measuring operation such that sufficiently precise information about aberrations can be obtained in short time. The method allows determining a layout, or "metrology pattern" of measuring points specific for the individual projection exposure system and a set of expected use conditions. A metrology pattern is also denoted "measuring point distribution" in this application.

To find such an optimum measuring point distribution, possible aberration patterns of considered use cases are considered and decomposed with respect to a (limited or complete) system of base functions. For the pupil functions or the wave front the Zernike polynomials are a typical example. For field coordinates, often Legendre polynomials or the like can be used.

It may be beneficial to generate a ranking of these patterns according to the probability of occurrence, their impact on optical imaging or others. The step of ranking may include sorting by eigenvalues.

The measuring positions are then chosen so that as many as possible relevant patterns can be distinguished by the measured values. Thus the measuring point distribution (metrology grid) may be determined by the ranking of aberration patterns.

In many cases, the measuring point distribution (metrology grid) will be independent of the individual projection exposure system since the optical design is common to all machines of a certain type. Further, the expected use cases, relating to the aberration patterns, may also be similar among the systems in many cases. On the other hand, the materials used for manufacturing components of the individual projection lenses may differ. As shown below, even such difference can motivate an individual choice for the metrology pattern.

Consider an EUV projection lens typically comprising a plurality of mirrors having substrates made of low-expansion glass like Zerodur® or ULE". This material may be characterized by a parameter called zero crossing temperature, ZCT, which is the temperature at which the coefficient of thermal expansion exactly vanishes. In a physical mirror blank (i.e. a block of material from which a mirror substrate is manufactured) the zero crossing temperature will be a function of position: $ZCT=ZCT(x, y)$. The relative deformation $\Delta l/l$ is given by $$\frac{\Delta l}{l} = \frac{\Delta l_0}{l} - \frac{\Delta l_0}{l} \frac{(T - ZCT)^2}{ZCT^2}$$

with $\Delta l_o/l$ being a negative constant. The corresponding deformation offset for T=ZCT typically is eliminated, e.g. during production, at least partially. In the following we consider that by assuming, just for example $$\frac{\Delta l}{l}(x, y) = -\frac{\Delta l_0}{l} \frac{(T(x, y) - ZCT(x, y))^2}{ZCT(x, y)^2}.$$

For illustration purposes assume that in a first blank the zero crossing temperature varies according to: $ZCT_1$ (x, y)=$ZCT_0$−α(x+b/2), $ZCT_0$ and α being constants (α>0). Parameter b is the field width in x direction.

Figure 4:
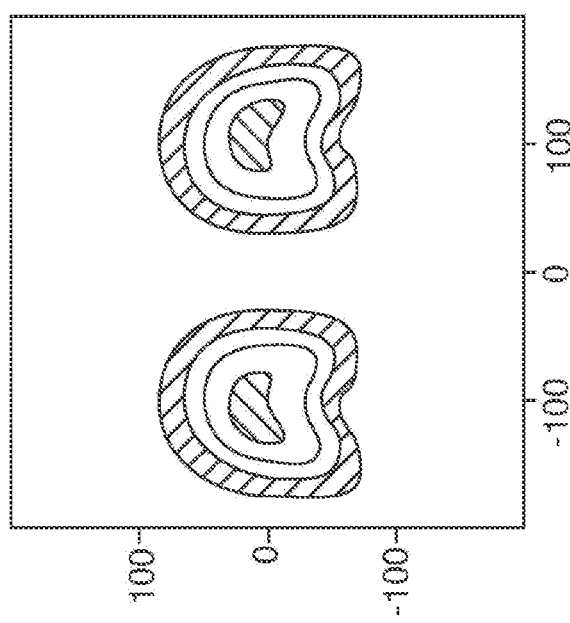
FIG. 4 shows an irradiation distribution on a mirror surface arranged at an intermediate position corresponding to the illumination setting of FIG. 3.

Assume further that the mirror made of this particular blank is positioned in the beam path optically near a systems intermediate plane (optically somewhere between a field plane (object surface, image surface or intermediate image surface) and a pupil plane, characterized by a corresponding sub-aperture ratio), and that a pattern of dense vertical lines illuminated by a leaf shape x dipole (FIG. 3) is being exposed. FIG. 4 shows an example of a corresponding irradiation distribution on a mirror at intermediate position according to an illumination setting of FIG. 3.

Figure 3:
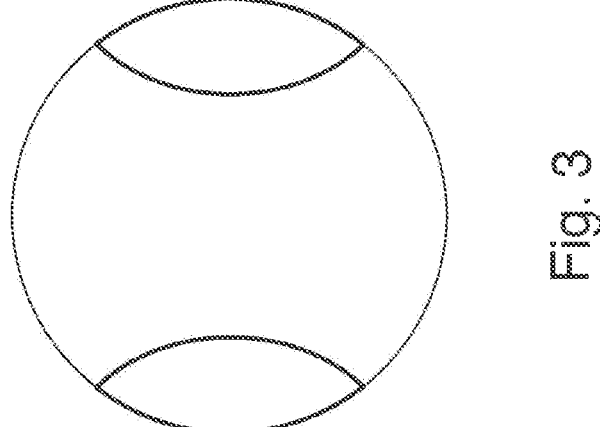
FIG. 3 shows schematically a leaf shape x dipole intensity distribution of illumination radiation for exposing dense vertical lines.

On the mirror the illumination pattern, with some moderate design distortion, will be seen as local intensity distribution leading to absorption and, in turn, to an increased temperature T(−b/2,0)=T(+b/2,0)=ZCT0+ΔT mainly in the darker central regions (interpret FIG. 3 now as mirror surface). On the left hand side of the mirror surface the following condition holds:

$ZCT_1(-b/2,0)=ZCT_0.$

Accordingly, a comparably small deformation D (−b/2,0) will occur, as the material is quite insensitive to heating at or close to zero crossing temperature. On the right hand side of the mirror surface, however, the following condition holds:

$ZCT_1(+b/2,0)=ZCT_0+\alpha b,$

It is evident that the difference to the local zero crossing temperature is greater by an amount defined by product ab. This will translate into a larger deformation D(+b/2,0) on the right hand side. As a result, a tilt of that surface will occur (together with higher contributions to aberration).

For a second blank, different from the first blank mentioned above, it is assumed that the condition $ZCT_1(x,y)=ZCT_0-\alpha'(x+b/2)^2$ holds, with a different constant α'≠α. Now the temperature changes at the left hand side and the right hand side of the mirror surface will lead to mainly the same deformations. Basically no tilt will be observed, but a significant surface curvature.

Figure 6:
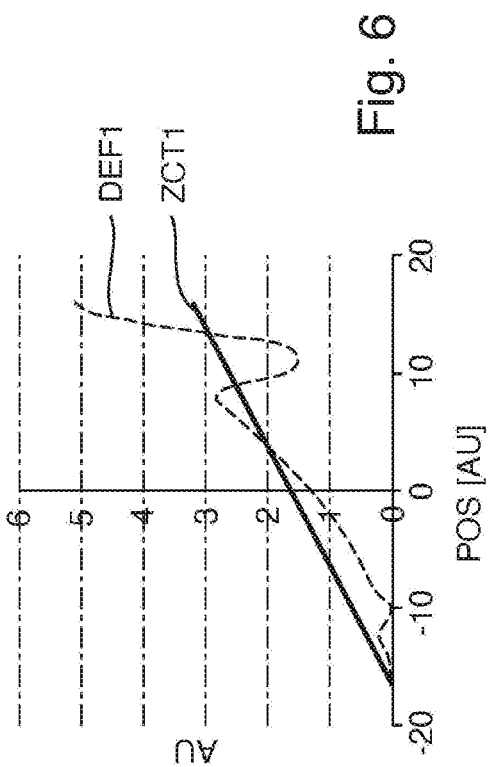
FIG. 6 shows an exemplary variation of zero crossing temperature in a first blank and a corresponding deformation according to a temperature distribution as shown in FIG. 5.
Figure 7:
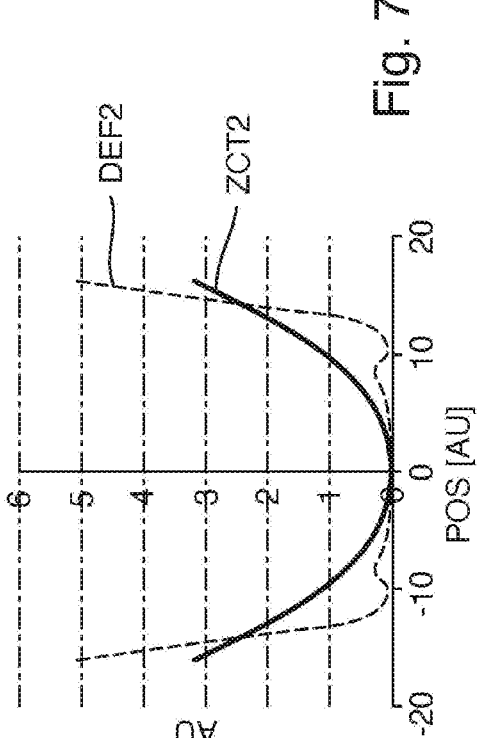
FIG. 7 shows an exemplary variation of zero crossing temperature in a second blank and a corresponding deformation according to a temperature distribution as shown in FIG. 5.
Figure 5:
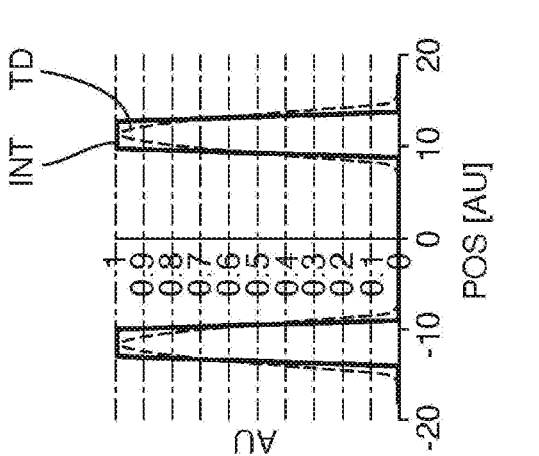
FIG. 5 shows an idealized cross-cut through an illumination intensity distribution according to FIG. 4 together with a corresponding temperature distribution on the mirror.

FIGS. 5, 6 and 7 further illustrate this scenario using diagrams with position POS in arbitrary units AU on the x-axis and arbitrary units AU on the y-axis. FIG. 5 shows an idealized cross-cut through an illumination intensity INT according to FIG. 4 together with corresponding temperature distribution TD. FIG. 6 shows an exemplary ZCT variation ZCT1 of a first blank and corresponding deformation DEF1 according to a temperature distribution as shown in FIG. 5. FIG. 7 shows an exemplary ZCT variation ZCT2 of a second blank and corresponding deformation DEF2 according to a temperature distribution as shown in FIG. 5. These figures show results of a numerical experiment, simplifying the real situation, just for illustration purposes.

To better understand this effect it should be remembered that the relative deformation does not vanish for T=ZCT, where the parabola has its apex, but at two different temperature points.

As the mirror of the example is positioned at an intermediate position in the projection lens, the position dependent deformation will cause a field dependent wave front distortion which qualitatively follows, e.g. in sense of a wave front RMS, the deformation variation shown.

This means that, for the same use case (same pattern on the mask, same illumination setting), for a system with the first blank, according to FIG. 6, the strongest thermal aberration effects are expected in one half side of the field, beginning not far from the field center. In contrast, for the second blank according to FIG. 7, both sides of the field are affected in a similar way, but at the outermost regions only.

Ideally, if this would be the only effect in the system, it would be preferable to place most measuring points in that affected field half side or near both field edges, respectively.

In reality, a superposition of plural mirrors as well as a set of different use cases should be considered. Nevertheless, the material properties of the individual mirror blanks often are measured or modelled and thus are known from the beginning, and relevant use cases can be identified. Based on simulation and/or calibration measurements (based on exemplary use cases), an optimized placement of measuring positions can be defined which gives, for the individual system, the best compromise between measurement accuracy and throughput loss due to the time required to measure a certain number of field points.

The exemplary optical system exhibits a mirror symmetry about the center line of the image field. A measuring point distribution may have the same mirror symmetry. The term "mirror symmetry" describes a situation in which, if a measuring point is placed at a co-ordinate (x, y), then there will also be a (mirror related) measuring point at (−x, y). Here y denotes the scan direction and the x direction being perpendicular to it in the field plane (at image side, basically perpendicular to the chief rays).

Figure 8:
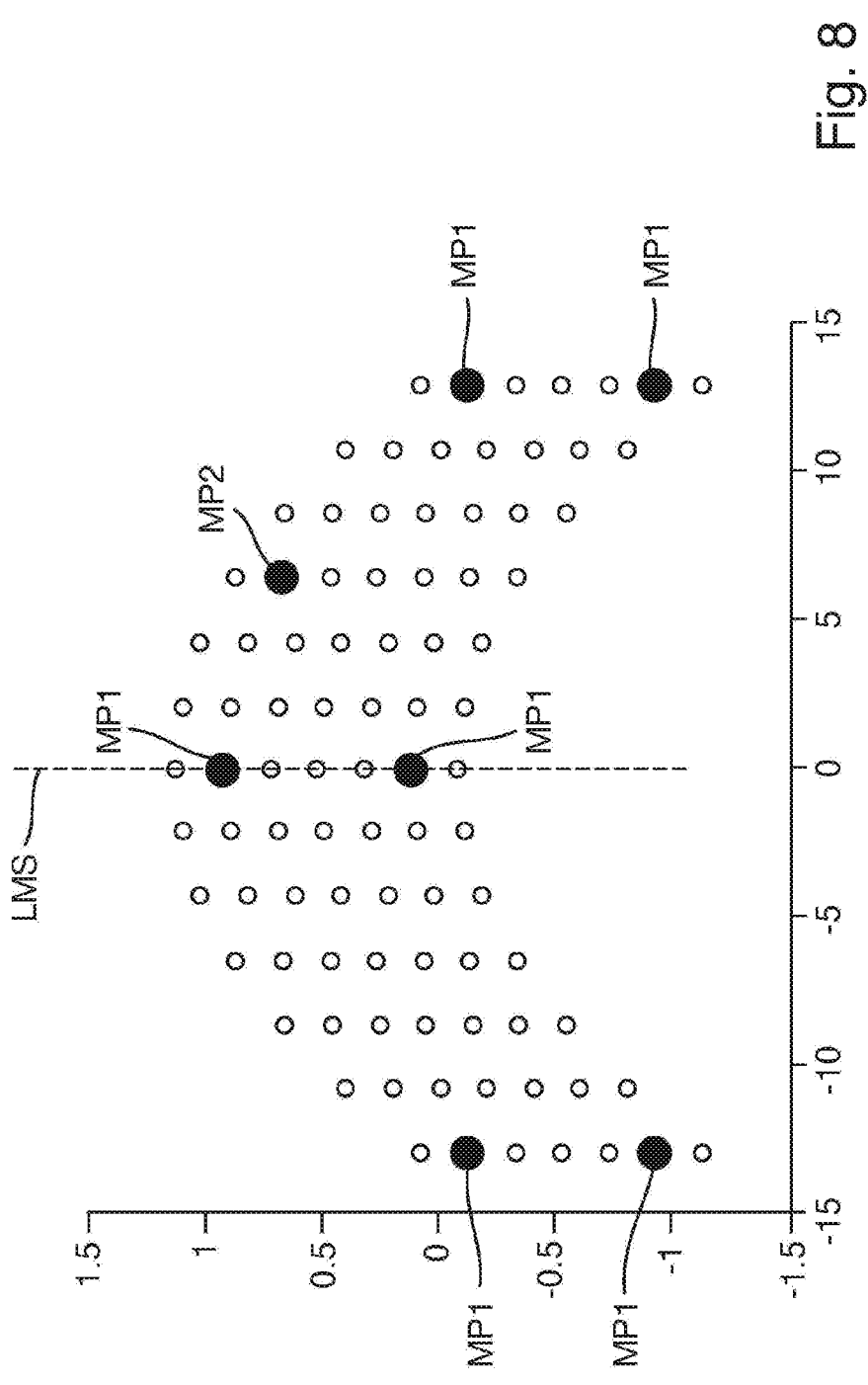
FIG. 8 shows an example of an asymmetric measuring point distribution including some measuring points distributed symmetrically to a line of mirror symmetry and single measuring points placed out of symmetry.

A more detailed analysis, however, shows that such a placement of measuring points (a measurement grid) is not necessarily optimal in all cases. FIG. 8 gives an example where some measuring points really are placed symmetrically. However, single points are deliberately placed out of symmetry.

In the example, the pattern of measuring points in the measuring point distribution may be subdivided into a first group of first measuring points MP1 which form a symmetric pattern symmetric to the line of mirror symmetry, LMS, and a second group including one or more second measuring points MP2 which do not have a corresponding measuring point at a mirror related position. In the example, there is only one such second measuring position MP2 in the second group in addition to first measuring points MP1 of the first group which are symmetry related to each other.

Measuring point distributions may be distinguished and selected depending on the number of manipulation degrees of freedom associated therewith. For example, it is possible that for a first measuring point distribution the aberration effect of two different manipulator actions, measured on these field points, appears to be the same. In this situation these two manipulator degrees effectively provide one degree of freedom only to the system correction, as it makes no difference in the aberration pattern seen from the first measuring point distribution whether the first or second manipulator is actuated. On the other hand, for a second measuring point distribution the aberration effects of the same two manipulator actions, measured on these different positions, may differ from each other. Accordingly, now two independent correction degrees of freedom can be used for system correction, based on the information measured on second measuring point distribution. In most cases more degrees of freedom enable a better correction potential, which would make the second measuring point distribution the preferred choice in that situation.

Figures 9A, 9B, 9C:
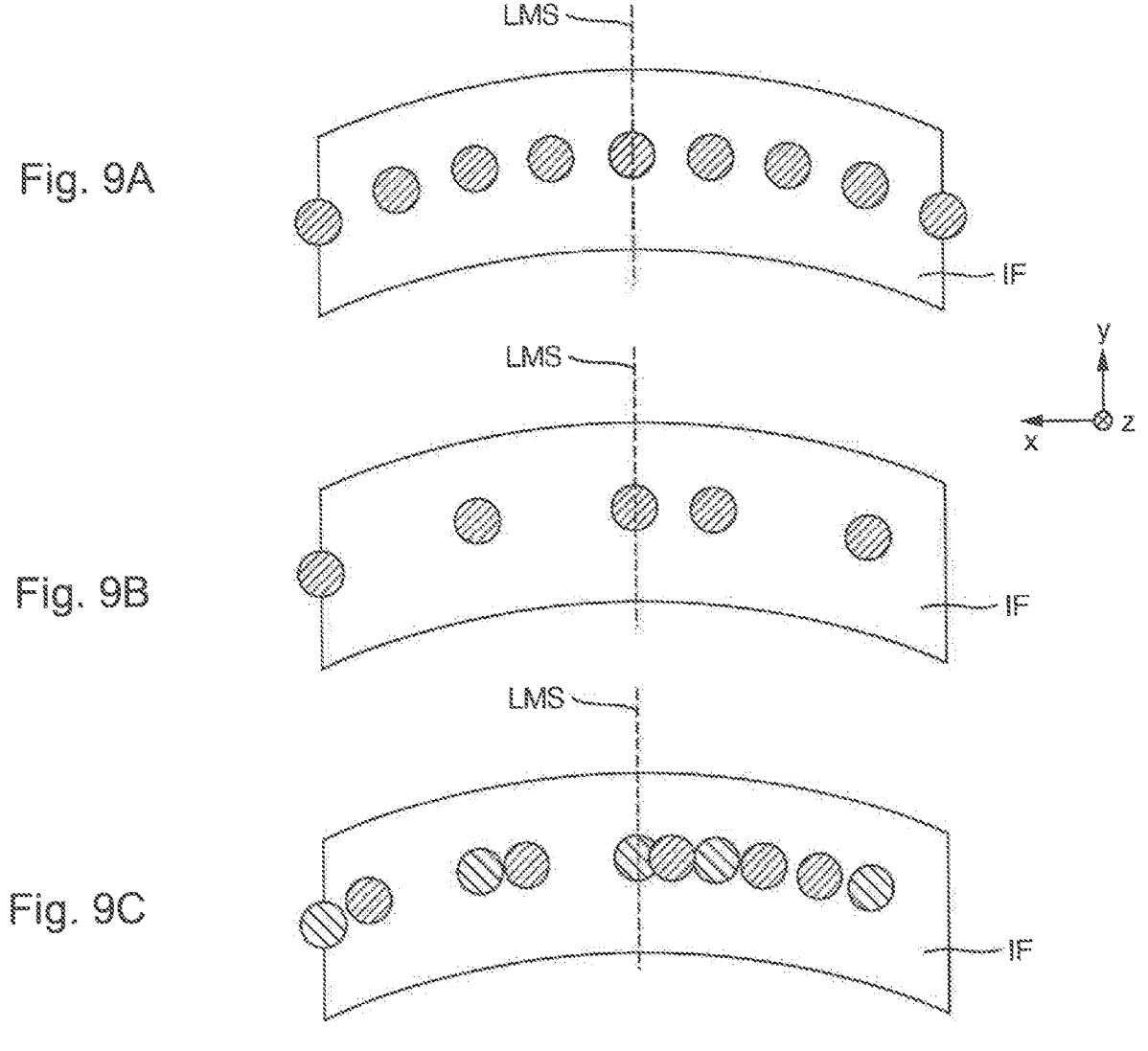

In the following, further explanations are provided explaining why adapting measuring point distributions to specific use cases can be beneficial in many cases. FIGS. 9A, 9B and 9C show schematically an image field IF with arcuate shape. The image field exhibits mirror symmetry with respect to a line LMS of mirror symmetry inherent to the projection lens. The line LMS of mirror symmetry runs parallel to the y-direction, which corresponds to the scanning direction used in operation (compare FIG. 1C). Each of the circles represents a measuring point of the measuring system. The measuring point distribution is mirror-symmetric with respect to the line of mirror symmetry LMS, since for each measuring point at coordinate x, y there is a corresponding measuring point at coordinate-x, y. There are equal distances in the x direction between neighboring measuring points.

FIG. 9B shows a first example of a measuring point distribution having a reduced number of measuring points when compared to the reference distribution of FIG. 9A. The measuring point distribution includes five instead of nine measuring points. The measuring point distribution is asymmetric with respect to the line LMS of mirror symmetry, since for each distance to the line LMS of mirror symmetry there is only one measuring point (instead of two measuring points at mirror-symmetrically opposing sides in the distribution of FIG. 9A). Considering the mirror symmetry of the optical system, the asymmetric measuring point distribution in FIG. 9B will yield the same information for each imaging property which is basically mirror-symmetric to the line LMS of mirror symmetry, since the reduced measuring point distribution in FIG. 9B still includes, for each absolute distance from the line LMS of mirror symmetry, the same number of measuring points at the same distances to the line LMS of mirror symmetry. A reduced number of measuring points will reduce the total measuring time in cases where the measuring points are measured one after the other (i.e. sequentially). Therefore, higher throughput can be obtained.

The measuring point distribution in FIG. 9C has the same number of measuring points as in the example of FIG. 9B. However, the concrete measuring positions are varied with respect to FIG. 9B. The measuring positions of FIG. 9B are indicated less densely hashed in FIG. 9C for comparison.

As already explained above, individually optimized measuring point distribution may be beneficial in many cases including the case where materials used for the optical elements in the optical system are not ideal. In reality, each lens blank or mirror blank will have a specific distribution of inhomogeneities which may affect the performance of the overall optical system. In the following, local areas having relatively lower quality than surrounding areas are denoted as "critical areas" CAn. In FIGS. 10 and 11 the left partial figures each show a material blank MBL having two critical areas CA1, CA2 indicated by elliptic marks. A critical area may, for example, exhibit a zero crossing temperature (ZCT) different from the zero crossing temperature of the surrounding material which makes up the most part of the blank. In each of FIGS. 10 and 11 the right hand part of the figure shows the respective arcuate image field IF including a number of measuring points MP (circles) and those areas where the imaging properties are most influenced by the critical areas in the material blank. In each case of FIGS. 10 and 11 the measuring positions are chosen so that at least one measuring position is capable of directly measuring those properties which are strongly influenced by the critical areas. Under certain use conditions, such as under radiation heating, those critical areas may cause a particularly high wavefront aberration which should be compensated using manipulators.

The arrows between the partial figures show that the location of the critical areas CA1, CA2 in the actual material correlates with those field points in which relatively high aberration level would be expected. Placing the measuring point MP1, MP2 in these locations is particularly useful, since it is expected that, during operation, those measuring positions will indicate very early a measurable signal even before other, less critical regions cause discernible deterioration of the wave front under the influence of the radiation. In other words: the inventors found that it can be beneficial to place a measuring point at those positions in the field where a local maximum of the absolute value of aberration level is to be expected. The optimum position for placing measuring points may be calculated if the location of critical areas in the material used is determined prior to assembly of the optical system.

Therefore, it is considered useful to determine for each concrete optical system to be assembled which material blank shall be used for which optical element. The location and distribution of critical regions on those blanks are then determined with a suitable material measuring method. Based on those data optical simulation can provide information about those locations in the image field where a local maximum of aberration would be expected when those critical areas cause wave front aberrations. It is considered useful to place measuring points at least in those locations where a local maximum of the absolute values of aberrations is expected based on the simulation. Following this routine it is possible that measurements at those critical locations indicate very early in the process whenever the level of aberration raises upon use of the optical system so that correcting manipulations can be initiated at an early stage, thereby ensuring that the total aberration level over the whole image field stays below a given threshold.

In the following the approach is explained in connection with FIGS. 12A and 12B using specific aberrations as an example to indicate the concept. In each of FIGS. 12A and 12B the x-axis indicates the x-position in the image field, with the center of the image field (on the line LMS of symmetry) in the middle at zero. The y-axis indicates the amplitude of a selected aberration represented by a corresponding Zernike value Z4 and Z13, respectively. The calculations leading to the results shown in FIGS. 12A and 12B correspond to different thermal loads on the optical system caused by using different illumination settings (annular or dipole) and different pattern on the mask. The thermal load caused in the optical system is basically influenced by the spectrum of diffraction angles caused by the specific pattern under the selected illumination setting. Different curves in each figure correspond to different use cases, characterized by different illumination settings and different structures.

The vertical lines parallel to the y-axis indicate exemplary field positions in which measuring points can be placed. For example, in FIG. 12A measuring point MP1 will be most useful for monitoring the aberration represented by curve C1, since the local maximum of this aberration would occur around this measuring position. Similarly, measuring point MP2 would be most helpful to indicate very early aberrations dominated by the aberration represented by curve C2, since this curve has a local maximum at the position of the second measuring point MP2.

Figure 12B:
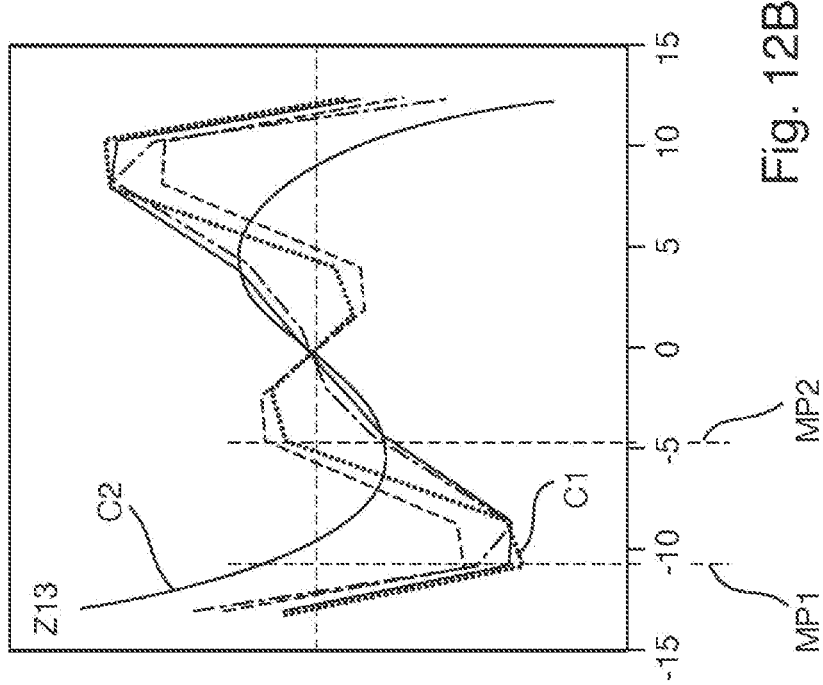
FIGS. 12A and 12B show different examples of how the local distribution of measuring points may be adapted to expected positions of local extrema of target aberrations (Z4 and Z13 in FIGS. 12A and 12B respectively) in the image field.
Figure 12A:
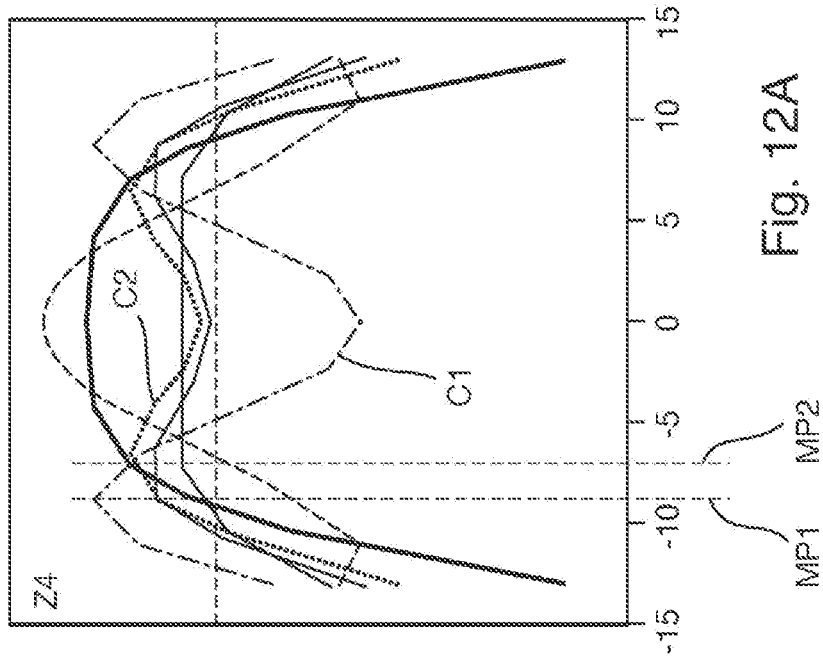

Likewise, measuring position MP1 in FIG. 12B would be most useful to monitor the buildup of aberrations represented by curve C1, while measuring position MP2 would be most useful to monitor aberrations dominated by the aberration represented by curve C2, since a local minimum of this aberration occurs at MP2.

It is to be understood that measurements performed at appropriately selected measuring points will yield best knowledge of the target aberrations and allow early compensation once the critical aberration builds up over time. This is why it is advisable to select the measuring point distributions for each use case individually in order to be able to measure at or close to those points where local maxima of absolute values of critical aberrations would be expected. Those locations are accessible by simulation and/or calibration in advance. In an exemplary process it is determined in one step which use case is actually performed in the exposure system. If optimum measuring point distribution for a selected number of typical use cases has been calculated beforehand, the appropriate measurement point distribution may be taken from a look-up table or the like. Based on the look-up table the measuring point distribution is selected and measurements are performed only on the measuring points of the measuring point distribution. If another use case is configured, a dynamic correction can be performed by using another measuring point distribution best adapted to the new use case.

Figures 13A, 13B, 13C:
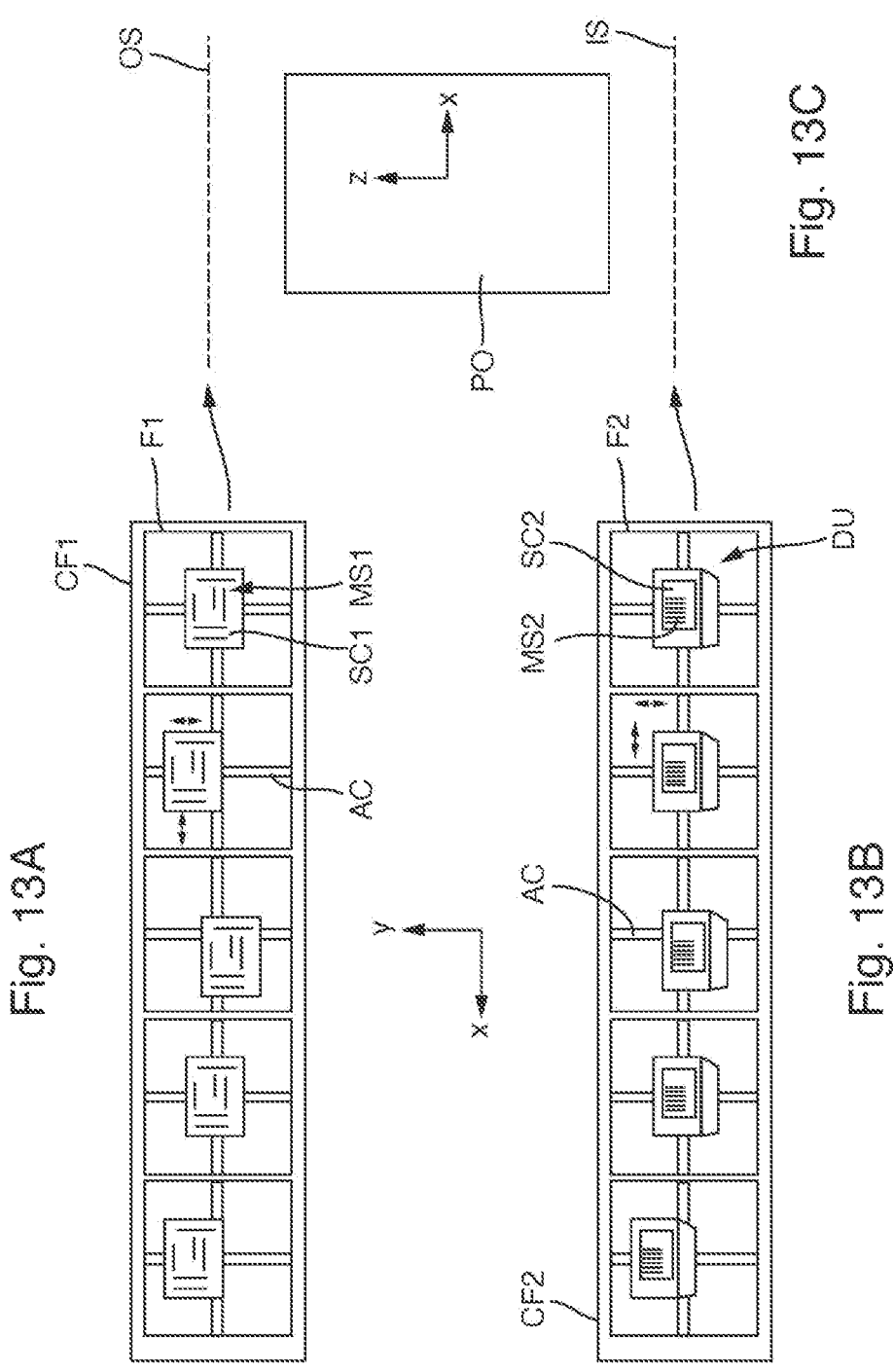
FIG. 13A, 13B and FIG. 13C show examples of object side (FIG. 13A) and image side (FIG. 13B) units of a measuring system capable of providing variable measuring point distributions for a projection objective (FIG. 13C).

An embodiment of a measuring system capable of being used in embodiments of the invention is now described in connection with FIGS. 13A, 13B and 13C. FIG. 13C shows a projection objective PO having an object surface OS and the image surface IS optically conjugate to the object surface. FIG. 13A shows schematically components of the measuring system to be placed in the object surface. FIG. 13B shows schematically components of the measuring system to be placed in the image surface in order to perform a measurement.

The measuring system is configured to measure the wave front of the projection radiation at a plurality of spaced apart measuring points distributed in the image field. The individual positions of the measuring points may be selected and set (or adjusted) variably depending on what is needed for the measurement. The measuring system is a multi-channel shearing interferometer capable of measuring the wave front at a plurality of field points in parallel. The number of different channels is five in the embodiment, but may be lower or higher.

Each measuring channel comprises a first structure carrier SC1 carrying a first measuring structure MS1 to be arranged in the object surface. The first measuring structure may be a two-dimensional grating, for example. A first frame F1 is provided for each of the first structure carriers to hold the structure carrier in position. Each first structure carrier can be moved relative to the first frame in two mutually perpendicular directions by actuators AC based on control signals of the control unit. The movement may be guided by rail structures carrying the first structure carriers SC1. The actuators may include piezoelectric elements. The first frames F1 are held in a first common frame CF1 so that the first frames are placed in a single straight row parallel to the x-direction.

On the image side of the projection objective second structure carriers SC2 are positioned for each of the measuring channels. Each second structure carrier carries a second measurement structure MS2 to be placed in the image surface IS for a measurement. The second measuring structure may be configured as a diffraction grating. Alternatively, the second measuring structure may be configured as a two-dimensional array of pinholes. Each of the second structure carriers SC2 is held in a second frame F2.

Each second structure carrier SC2 is part of a detector unit DU including the second structure carrier SC2 and a detector configured to detect with spatial resolution interference patterns generated when projection radiation influenced by the first measuring structure MS1 has passed the projection objective PO and the second measurement structure MS2. The detector unit may include a CCD chip or similar component having a two-dimensionally extended sensitive area and an optical system arranged between the second structure carrier SC2 and the sensitive area. An evaluation device for evaluating the pattern incident on the sensitive area is not shown.

Actuators AC, e.g. piezoelectric actuators, are provided to move the detector units in mutually orthogonal directions parallel to the image surface based on control signals of the control unit. The movement may be guided by rail structures carrying the detector units. The second frames F2 are held in a second common frame CF2 so that the second frames are arranged in a single straight row parallel to the x-direction.

Upon setup of the exposure system for a new use case the optimum positions for placing measuring points in the image field are calculated or taken from a pre-calculated look-up table.

The first structure carriers SC1 are then moved individually to their desired measuring positions optically conjugate to the measuring positions in the image field. The movement is caused by the piezoelectric actuators AC. Similarly, each detector unit DU including the respective second measuring structure MS2 is moved to the desired measuring position in the image field using the piezoelectric actuators for lateral movement. In other words: each detector unit of a measuring channel is positioned in a position optically conjugate to the respective first structure carrier in the image surface so that the wave front can be measured for this specific selected field point(s) in the respective measuring channel.

In an alternative embodiment (not shown) only the detector units to be placed in the image surface are configured to be movable in two orthogonal directions so that they can be placed at the desired measuring positions. In the object plane a large number of individual first structure carriers is placed with a spatial density sufficiently high so that for each potential measuring position in the image field there is a first structure carrier relatively close to the optically conjugate object point. The measurement is then performed with the closest first structure carrier, while the detector unit is positioned at a measuring position close to the optically conjugate field point in the image field.

Measurements may be performed at the operating wavelength of the exposure system (EUV radiation in the example). Alternatively, or in addition, other wavelengths may be used.

Methods and systems of the present disclosure may be utilized in a catadioptric or refractive system working in the DUV spectral range. Typically, the image field may be rectangular instead or arcuate in that case. Similar measuring point distributions and calculations may be used. Characteristic aberration patterns specific for certain use cases may be caused or dominated by changes in refractive index and surface deformations of lenses under radiation load ("lens heating"). Examples for exposure systems including a wave front manipulation system for dynamically influencing the wave front of the projection radiation travelling from the object plane to the image plane are disclosed, for example, in applicants' applications WO 2018/219870 A1, WO 2014/139719 A1, DE 10 2016 205 618 A1, US 2020/0081350 A1 or EP 2 219 077 A1. The disclosures of these patent applications regarding the layout of the exposure apparatus and the wave front manipulation systems are incorporated herein by reference.

What is claimed is:

1. A method of setting up a projection exposure system for exposing a radiation sensitive substrate with at least one image of a pattern, the projection exposure system comprising:

an illumination system configured to generate illumination radiation directed onto the pattern in an illumination field;

a projection lens comprising a plurality of optical elements configured to project a part of the pattern lying in the illumination field onto an image field at the substrate with projection radiation, wherein the image field exhibits mirror symmetry with respect to a line of mirror symmetry, a measuring system configured to measure at least one property of the projection radiation representing an aberration level at a plurality of spaced apart measuring points distributed in the image field;

an operating control system comprising at least one manipulator operatively connected to one of the optical elements of the projection exposure system to modify imaging properties of the projection exposure system based on measurement results generated by the measuring system;

the method comprising:

determining, in a measuring point distribution calculation, a measuring point distribution defining a number and positions of measuring points to be used in a measurement, wherein the measuring point distribution is asymmetric with respect to the line of mirror symmetry, and performing the measuring point distribution calculation under boundary conditions representing at least:

(i) manipulation capacities of the operating control system;

(ii) measuring capacities of the measuring system; and (iii) predefined use case scenarios defining a set of representative use cases, wherein each use case corresponds to a specific aberration pattern generated by the projection exposure system under a predefined set of use conditions.

2. The method according to claim 1, wherein the measuring point distribution calculation comprises:

calculating, for all the manipulators and the number of field points available for acquiring measuring data, a dependency value representing a relationship between a defined actuating value change at the manipulator and a resultant effect on aberrations at each of the field points.

3. The method according to claim 2, wherein the dependency values are represented in a dependency matrix A and the number $M^*$ of correction degrees of freedom of the operating control system is determined as $M^*=\text{rank }(A)$.

4. The method according to claim 1, wherein the measuring point distribution calculation comprises:

calculating, for a number M of the manipulators, a number $M^*$ of correction degrees of freedom of the operating control system, wherein $M^*{\leq}M$.

5. The method according to claim 1, wherein the measuring point distribution calculation comprises:

determining possible measuring positions in the set of field points and a maximum number $F^*$ of measuring positions according to restrictions of the measuring system.

6. The method according to claim 1, wherein the measuring point distribution calculation comprises:

defining a reduced number f of measuring points and identifying, for this number of field points, those field points exhibiting a largest effect of an actuating value change at a given one of the manipulators on the aberration level.

7. The method according to claim 1, wherein the measuring point distribution calculation comprises:

defining a set of representative use cases, wherein each use case corresponds to perturbations generated under a predefined set of use conditions, determining for each of the use cases a representative aberration pattern;

decomposing the respective aberration patterns with respect to a system of base functions so that an aberration pattern is represented by coefficients in terms of the base functions;

calculating a change in coefficients at a set of field points for all manipulators.

8. The method according to claim 1, wherein a pattern of measuring points in the measuring point distribution is subdivided into a first group of measuring points which form a symmetric pattern symmetric to the line of mirror symmetry, and a second group including one or more measuring points which do not have a corresponding measuring point at a mirror related position.

9. The method according to claim 1, wherein the measuring point distribution calculation comprises determining locations in the image field of an expected local maximum of an absolute value of an aberration and the measuring point distribution is determined such that the measuring points are positioned at least in locations of the expected local maximum of the absolute value of aberrations.

10. The method according to claim 1, wherein a predefined set including multiple differing measuring point distributions is pre-calculated and an end user selects between the pre-calculated measuring point distributions based on the actual use case for which the projection exposure system is used.

11. A projection exposure method for exposing a radiation sensitive substrate with at least one image of a pattern comprising:

generating illumination radiation directed onto the pattern in an illumination field;

projecting a part of the pattern lying in the illumination field onto an image field at the substrate with projection radiation using a projection lens comprising a plurality of optical elements, wherein the image field exhibits mirror symmetry with respect to a line of mirror symmetry;

measuring at least one property of the projection radiation representing an aberration level at a plurality of spaced apart measuring points distributed in the image field in accordance with a measuring point distribution defining a number and positions of measuring points used in a measurement using a measuring system, wherein the measuring point distribution is asymmetric with respect to the line of mirror symmetry;

modifying imaging properties of the projection exposure system based on measurement results generated by the measuring system by an operating control system comprising at least one manipulator operatively connected to one of the optical elements of the projection exposure system, the method comprising:

performing, in a first use case, a first exposure by illuminating a first pattern with illumination radiation according to a first illumination setting;

reconfiguring the projection exposure system from a first configuration adapted to the first use case to a second configuration adapted to a second use case different from the first use case;

performing, in a second use case, a second exposure by illuminating a second pattern with illumination radiation according to a second illumination setting;

determining for each of the first use case and the second use case a corresponding first measuring point distribution and a second measuring point distribution;

measuring the at least one property of the projection radiation separately for each of the first and second use case at measuring points distributed according to the first measuring point distribution and the second measuring point distribution, and modifying imaging properties of the projection exposure system separately for the first and the second use case based on measurements performed based on the first measuring point distribution and the second measuring point distribution.

12. A projection exposure method for exposing a radiation sensitive substrate with at least one image of a pattern comprising:

generating illumination radiation directed onto the pattern in an illumination field;

projecting a part of the pattern lying in the illumination field onto an image field at the substrate with projection radiation using a projection lens comprising a plurality of optical elements;

measuring at least one property of the projection radiation representing an aberration level at a plurality of spaced apart measuring points distributed in the image field in accordance with a measuring point distribution defining a number and positions of measuring points used in a measurement using a measuring system; and modifying imaging properties of the projection exposure system based on measurement results generated by the measuring system by an operating control system comprising at least one manipulator operatively connected to one of the optical elements of the projection exposure system, wherein the image field exhibits mirror symmetry with respect to a line of mirror symmetry and the measuring point distribution is asymmetric with respect to the line of mirror symmetry.

13. The method according to claim 12, further comprising subdividing a pattern of measuring points in the measuring point distribution into a first group of measuring points which form a symmetric pattern symmetric to the line of mirror symmetry, and a second group including one or more measuring points which do not have a corresponding measuring point at a mirror related position.

14. The method according to claim 12, wherein the image field comprises expected locations of a local maximum of an absolute value of an aberration and the measuring point distribution is such that measuring points are positioned at least in expected locations of a local maximum of the absolute value of an aberration.

15. A projection exposure system for exposing a radiation sensitive substrate with at least one image of a pattern, comprising:

an illumination system configured to generate illumination radiation directed onto the pattern in an illumination field;

a projection lens comprising a plurality of optical elements configured to project a part of the pattern lying in the illumination field onto an image field at the substrate with projection radiation, wherein the image field exhibits mirror symmetry with respect to a line of mirror symmetry, a measuring system configured to measure at least one property of the projection radiation representing an aberration level at a plurality of spaced apart measuring points distributed in the image field according to two or more different measuring point distributions, a measuring point distribution defining a number and positions of measuring points used in a measurement;

an operating control system comprising at least one manipulator operatively connected to an optical element of the projection exposure system to modify imaging properties of the projection exposure system based on measurement results generated by the measuring system;

a measuring point distribution determination system configured to determine a measuring point distribution defining a number and positions of measuring points used in a measurement, specific for a use case, wherein the measuring point distribution is asymmetric with respect to the line of mirror symmetry.

16. The system according to claim 15, wherein the measuring system is configured to measure at least two measuring points of a measuring point distribution in parallel.

17. The system according to claim 15, wherein the measuring system is configured to measure at least two measuring points of a measuring point distribution sequentially.

18. The projection exposure system of claim 15, wherein the measuring point distribution determination system is configured to determine the measuring point distribution based upon a number of manipulation degrees of freedom of the at least one manipulator.

19. The projection exposure system of claim 15, wherein the measuring point distribution determination system is configured to determine the measuring point distribution based upon a boundary condition of the measuring system.

20. The projection exposure system of claim 15, wherein a pattern of measuring points in the measuring point distribution is subdivided into a first group of measuring points which form a symmetric pattern symmetric to the line of mirror symmetry, and a second group including one or more measuring points which do not have a corresponding measuring point at a mirror related position.

21. The projection exposure system of claim 15, wherein the measuring point distribution determination system is configured to determine multiple differing measuring point distributions and select one of the multiple differing measuring point distributions in response to an end user selection based on a use case for the projection exposure system.

22. The projection exposure system of claim 15, wherein the measuring point distribution determination system is configured to determine the measuring point distribution such that measuring points are positioned at least in expected locations of a local maximum of the absolute value of an aberration.

\* \* \* \* \*